United States Patent [19]

Ikeuchi et al.

[11] Patent Number: 5,386,109
[45] Date of Patent: Jan. 31, 1995

[54] PRE-AMPLIFIER FOR OPTICAL RECEIVING AND OPTICAL RECEIVER USING THE SAME

[75] Inventors: Tadashi Ikeuchi; Kazuyuki Mori; Nobuhiro Fujimoto, all of Kawasaki, Japan

[73] Assignee: Fujitsu Limited, Kawasaki, Japan

[21] Appl. No.: 108,059

[22] Filed: Aug. 17, 1993

[30] Foreign Application Priority Data

Aug. 19, 1992 [JP] Japan .................. 4-219906

[51] Int. Cl.⁶ .............................. H01J 40/14
[52] U.S. Cl. .................. 250/214 R; 250/214 A; 327/514
[58] Field of Search ...... 250/214 R, 214 LA, 214 LS, 250/214 A, 551; 307/311

[56] References Cited

U.S. PATENT DOCUMENTS

| | | | |
|---|---|---|---|
| 4,498,197 | 2/1985 | Chown | 307/311 |
| 4,764,732 | 8/1988 | Dion | 250/214 A |
| 4,791,286 | 12/1988 | Wall | 250/214 A |
| 4,808,810 | 2/1989 | Van Doorn | 250/214 A |

FOREIGN PATENT DOCUMENTS 4238514 8/1992 Japan .

Primary Examiner—David C. Nelms
Assistant Examiner—Stephone B. Allen

[57] ABSTRACT

The present invention relates to an optical receiving pre-amplifier and an optical receiver using the same. The object of the invention is to provide an optical receiving pre-amplifier having an enlarged dynamic range to a large output swing, and an optical receiver having a simplified circuit configuration and a sufficient eye aperture and suitable for a parallel transmission. The optical receiving pre-amplifier includes an input FET 10 with a gate terminal 10a to receive a current signal from a light receiving element and an output FET 12 with the gate terminal 12a connected to the signal terminal 10b of the input FET 10 to amplify and output the current signal to a predetermined voltage signal. A feedback resistor 14 is connected between the gate terminal 10a of the input FET 10 and the output terminal 19 of the output FET 12. A current source 15 can enlarge an output potential amplitude of the output FET 12 to a light signal change and is arranged between the gate terminal 10a of the input FET 10 and the power source 17.

29 Claims, 25 Drawing Sheets

○——○ EMBODIMENT
×——× PRIOR ART EXAMPLE

PRE-AMPLIFIER FOR OPTICAL RECEIVING AND OPTICAL RECEIVER USING THE SAME

BACKGROUND OF THE INVENTION

1. Field of the Invention

The present invention relates to a pre-amplifier for optical receiving and an optical receiver using the same.

2. Description of the Related Art

In recent years, with the improved processing speed of communications systems and computers, optical signal communication between systems has been demanded. For such a communication system, small, low cost, adjustment-free optical receivers have been desired. Particularly, it has been desired to realize reduced cost and low power consumption in an optical communication system with a bit rate of less than 1 Gbps.

FIG. 29 is a block diagram showing the circuit configuration of an optical receiver. In FIG. 29, the optical receiving trans impedance-type pre-amplifier 1A, described later with FIG. 30, amplifies and outputs to a predetermined voltage signal a current signal converted from an optical signal by a light receiving element (photoelectric element such as a photo-diode) 2.

Numeral 3C represents a reference detector described later according to FIGS. 31 and 32. The reference detector 3C detects the center potential of an amplitude of an output signal from the pre-amplifier 1A and produces its potential as a standard reference potential for the amplifying operation of a limiter amplifier 4 to output to a limiter amplifier 4. The limiter amplifier 4 amplifies the output signal of the pre-amplifier based on the reference potential from the reference detector 3C.

The trans impedance-type pre-amplifier 1A, as shown in FIG. 30, is formed of four field effect transistors 10, 11A, 12, and 13A (hereinafter referred to FET), a feedback resistor (with a resistance value Rf) 14, and two diodes 20 and 21. The FET 11A acts as a load resistor and FET 13A acts as constant current source (load resistance).

In the pre-amplifier 1A, a current signal converted from an optical signal by the light receiving element 2 is inputted to the gate terminal 10a of the input FET 10 via an input terminal 18. A first power source (positive power source Vdd or GND 0 V) 16 is connected to the drain terminal (one signal terminal) 10b of the input FET 10 via the load FET 11A and a second power source (GND or negative power source Vss) 17 is connected to the source terminal (the other signal terminal) 10c via the diode 20.

The output FET 12 has a gate terminal 12a connected to the drain terminal 10b of the input FET 10, a drain terminal 12b connected to the first power source 16, and a source terminal 12c connected to the second power source 17 via the diode 21 and the load FET 13A. The amplified result amplified to a predetermined voltage value is outputted from the output terminal 19 connected to the source terminal 12c of the output FET 12.

A feedback resistor 14 supplies the output signal of the output FET 12 back to the gate terminal 10a of the input FET 10 and is arranged between the gate terminal 10a of the input FET 10 and the output terminal 19 (diode 21) of the output FET 12.

The load FET 11A has a gate terminal 11a and a source terminal 11c connected to the drain terminal 10b of the input FET 10 and to the gate terminal 12a of the output FET 12, and a drain terminal 1ib connected to the first power source 16. The load FET 13A has a gate terminal 13a and a source terminal 13c connected to the second power source 17 and a drain terminal 13b connected to a feedback resistor 14 and a diode 21.

In the trans impedance-type pre-amplifier 1A, a current signal Iin is supplied to the gate terminal 10a of the input FET 10 via the input terminal 18. The current signal is obtained by converting to an optical signal by the light receiving element 2 an optical signal representing a digital signal received by way of an optical fiber (not shown) from the transmission side. The potential of the drain terminal 10b of the input FET 10 is supplied to the gate terminal 12a of the output FET 12 and the potential of the source terminal 12c of the output FET 12 is outputted as an amplified result from the output terminal 19.

The reference detector 3C, as shown in FIG. 31, is constituted of a high level peak potential detector 3a for detecting a high level peak potential of an output signal of the pre-amplifier 1A, a low level peak potential circuit 3b for detecting a low level peak potential of an output signal of said pre-amplifier 1A, and an average value detector 3c for averaging the peak potentials from the above detectors 3a and 3b to output the averaged result as a predetermined standard reference potential to the limiter amplifier 4.

The high level peak potential detector 3a, as shown in FIG. 32(a), is formed of a diodes D1 and a capacitor C1. The low level peak potential detector 3b, as shown in FIG. 32(b), is formed of a diode D2 and a capacitor C2. The average value detector 3c, as shown in FIG. 32(c), is formed of two resistors R1 and R2 having the same resistance value to each other.

The pre-amplifier 1A shown in FIG. 30 has an output voltage to input current characteristic as shown in FIG. 33. For example, with the use of the power source voltage of 5 volts, the pre-amplifier 1A saturates with the output amplitude of more than 0.6 v. For that reason, an intensive light hitting the light receiving element 2 may vary the duty of the output waveform of the pre-amplifier 1A so that eye pattern (eye diagram) cannot be recognized because of its glared state.

The eye pattern is used to evaluate the degree of the inter-sign interference due to transmission distortion by using an aperture ratio (eye aperture: the unoverlapped portion when all possible pulse waveforms produced between two signal intervals are overlapped to display) of a waveform pattern which is overlapped on a cathode-ray tube a received and demodulated base band signal series by time-sweeping synchronously with bit. This procedure limits the dynamic range of the receiver.

Hence, as shown in FIG. 30, a diode is connected in parallel across the feedback resistor 14. This circuit configuration can limit the input current Iin to less than a fixed amplitude by making the diode conductive to form a by-pass circuit for an optical current when the input current Iin exceeds a fixed value.

However, in the above circuit, a sufficient eye aperture cannot be obtained because the output waveform duty of the pre-amplifier 1A varies in principle and the eye pattern is blinded. The above circuit configuration cannot be adopted to the system. The reason is that if the eye pattern does not have a sufficient eye aperture for a received signal corresponding to each optical signal, each channel cannot be recognized when each channel must be recognized with common clocks in the parallel transmission of plural channel optical signals.

As described above, there is a disadvantage in that the optical receiving pre-amplifier, as shown in FIG. 30, cannot establish a wide dynamic range and sufficient eye aperture because an insufficient output amplitude causes a waveform distortion due to an intensive light hitting the light receiving element 2.

In the optical receiver, as shown in FIG. 29, since the pre-amplifier 1A has a wide dynamic range, the reference detector 3C receives an input voltage with a large swing of amplitude. Most of the peak potential detectors 3a and 3b in the reference detector 3C are formed of a diode and a capacitor, as shown in FIGS. 32(a) and 32(b).

However, it is very difficult to obtain accurately the center potential (reference potential) over all levels in the configuration that the outputs of the peak potential detectors 3a and 3b are inputted to the average value detector 3c. Particularly, when the input level is small, the probability that a large error occurs is very high.

It is difficult that the optical receiving pre-amplifier establishes usually a sufficient eye aperture because of an error in a reference potential when an optical parallel transmitting receiver identifies plural received signals (channels) using common clocks, whereby plural received signals cannot be identified certainly. Since the capacitors C1 and C2 with larger capacitance value in the reference detector 3C can make the error small, an optical parallel receiver formed in an IC device requires a relatively large capacitor therein, thus resulting in an increased cost.

As described above, in the optical receiver shown in FIG. 29, since the reference detector 3C cannot detect accurately a reference to the dynamic range of an output of the pre-amplifier 1A, a sufficient eye aperture cannot be established at all times, whereby it is difficult to recognize each channel with common clocks at parallel receiving time.

There is a problem that a feedback in a circuit using a variable gain circuit may cause a possible oscillation. Moreover, in a system including plural optical receivers arranged in parallel, there is a disadvantage in that a reference detector 3C with a capacitor of large capacitance requires for each channel, thus resulting in a large-sized IC built-in circuit and an increased cost.

SUMMARY OF THE INVENTION

The present invention is made to overcome the above mentioned problems. An object of the present invention is to provide an optical receiving pre-amplifier which can realise a simplified circuit configuration and a large output amplitude, thus resulting in a wide dynamic range and an available sufficient eye aperture.

Another object of the present invention is to provide an optical receiver where there is no possible oscillation due to an applied feedback control, a reference voltage is maintained at a fixed value, and a sufficient eye aperture can be established at all times, thus realizing reduced IC and circuit scale and low power consumption.

In order to achieve the above objects, the optical receiving pre-amplifier according to the present invention, an optical receiving pre-amplifier comprising: an input field effect transistor having a gate terminal receiving a current signal converted from an optical signal by a light receiving element, one signal terminal connected to a first power source via a resistance element, and an other signal terminal connected to a second power source; an output field effect transistor having a gate terminal connected to the one signal terminal of the input field effect transistor, one signal terminal connected to the first power source, and an other signal terminal connected to the second power source via a resistance element, for amplifying the current signal into a predetermined voltage signal to issue from an output terminal; a feedback resistor connected between the gate terminal of the input field effect transistor and the output terminal of the output field effect transistor, for feeding an output signal of the output field effect transistor back to the gate terminal of the input field effect transistor; and a constant current source connected between the gate terminal of the input field effect transistor and the second power source, for amplifying a change in an amplitude of the output potential of the output field effect transistor in response to a change in an optical signal.

According to the present invention, the constant current source comprises a constant current supplying field effect transistor having one signal terminal connected to the gate terminal of the input field effect transistor, and an other signal terminal connected to the second power source via a resistance element; and a monitoring field effect transistor having the same characteristic as that of the constant current supplying field effect transistor; the monitoring field effect transistor having one signal terminal connected to the first power source via a resistance element and to a gate terminal of the constant current supplying field effect transistor; the monitoring field effect transistor having an other signal terminal and a gate terminal connected to the second power source.

Furthermore, according to the present invention, the gate terminal of the monitoring field effect transistor is connected to the first power source via a resistance element and to the second power source via a resistance element, and the other terminal of the monitoring field effect transistor is connected to the second power source via a resistance element.

The gate terminal of the monitoring field effect transistor may be connected to the first power source and the second power source via a variable resistor, and the other signal terminal of the monitoring field effect transistor may connected to the second power source via a resistance element.

An optical receiver comprising a light receiving element for converting a received optical signal into a current signal; pre-amplifier for amplifying and outputting the current signal from the light receiving element into a predetermined voltage signal; a limiter amplifier for amplifying the output signal from the pre-amplifier based on a predetermined standard reference potential; and a standard reference potential generator for producing a center potential of the amplitude of the output signal from the pre-amplifier as the predetermined standard reference potential to the limiter amplifier; the pre-amplifier including an input field effect transistor having a gate terminal receiving the current signal converted from the optical signal by the light receiving element, one signal terminal connected to a first power source via a resistance element, and an other signal terminal connected to the second power source; an output field effect transistor having a gate terminal connected to the one signal terminal of the input field effect transistor, one signal terminal connected to the first power source via a resistance element, and an other signal terminal connected to the second power source via a resistance element, for amplifying and outputting the current signal into a predetermined voltage signal; a feedback resistor connected between the gate terminal of the input field effect transistor and the output terminal of the output field effect transistor, for feeding an output signal of the output field effect transistor back to the gate terminal of the input field effect transistor; and a constant current source connected between the gate terminal of the input field effect transistor and the second power source, for amplifying a change in an amplitude of the output potential of the output field effect transistor in response to a change in an optical signal.

According to the present invention, the reference potential generator comprises a high level peak detector for detecting a high level peak potential detector of the output signal of the pre-amplifier; and a low level peak potential detector for detecting a low level peak potential of the output signal of the pre-amplifier; and an average value detector for averaging respective peak potentials detected by the high level peak potential detector and the low level peak potential detector and for providing an average result as the predetermined standard reference potential to the limiter amplifier.

According to the present invention, the high level peak potential detector has the same circuit configuration as that of the pre-amplifier; whereby when no input signal is inputted to the gate terminal of the input field effect transistor in the high level peak potential detector, an output signal of the output field effect transistor of the high level peak potential detector is outputted as a high level peak potential to the average value detector.

According to the present invention, the standard reference potential generator is constituted as a fixed reference potential generator for producing a fixed reference potential as the predetermined standard reference potential to the limiter amplifier when an optical signal power-adjusted by an automatic power adjusting circuit on an optical transmission side is received.

According to the present invention, the constant current power source comprises a constant current supplying field effect transistor having one signal terminal connected to the gate terminal of the input field effect transistor, and an other signal terminal connected to the second power source via a resistance element; and a monitoring field effect transistor having the same characteristic as that of the constant current supplying field effect transistor; the monitoring field effect transistor having one signal terminal connected to the first power source via a resistance element and to a gate terminal of the constant current supplying field effect transistor; the monitoring field effect transistor having an other signal terminal and a gate terminal connected to the second power source.

An optical receiver according to the present invention comprises an electric field absorption-type optical modulator for attenuating a received optical signal in accordance with a bias voltage and then outputting to the light receiving element; a comparison amplifier for comparing a predetermined standard potential with an output signal of the average value detector in the standard reference potential generator, outputting a deviation amplified as a bias voltage of the electric field absorption-type optical modulator, and controlling the attenuation amount of an optical signal by using the electric field absorption-type optical modulator; and a standard potential generator for producing the predetermined standard potential to output to the comparison amplifier.

An optical receiver according to the present invention comprises an electric field absorption-type optical modulator for attenuating a received optical signal in accordance with a bias voltage and for inputting to the light receiving element; a center potential generator for producing a center potential of the amplitude of the output signal based on the output signal from the pre-amplifier; a comparison amplifier for comparing a predetermined standard potential with an output signal from the center potential generator, outputting a deviation amplified as a bias voltage of the electric field absorption-type optical modulator, and controlling an attenuation amount of an optical signal by using the electric field absorption-type modulator; and a standard potential generator for producing the predetermined standard potential to output to the comparison amplifier; and the reference potential generator is constituted as a fixed reference potential generator for producing a fixed reference potential as the predetermined standard reference potential to output to the limiter amplifier.

According to the optical receiver of the present invention, wherein the fixed reference potential generator acts as the standard potential generator.

An optical receiver comprising a plurality of optical receiving processors arranged in parallel; each of the optical receiving processors including a light receiving element for converting a received optical signal into a current signal; a pre-amplifier for amplifying and outputting the current signal from the light receiving element into a predetermined voltage signal; and a limiter amplifier for amplifying the output signal from the pre-amplifier based on a predetermined standard reference potential; the pre-amplifier including an input field effect transistor having a gate terminal receiving a current signal converted from an optical signal by a light receiving element, one signal terminal connected to a first power source via a resistance element, and an other signal terminal connected to a second power source; an output field effect transistor having a gate terminal connected to the one signal terminal of the input field effect transistor, one signal terminal connected to the first power source, and an other signal terminal connected to the second power source via a resistance element, for amplifying and outputting the current signal into a predetermined voltage signal; a feedback resistor connected between the gate terminal of the input field effect transistor and the output terminal of the output field effect transistor, for feeding an output signal of the output field effect transistor back to the gate terminal of the input field effect transistor; and a constant current source connected between the gate terminal of the input field effect transistor and the second power source, for amplifying a change in an amplitude of the output potential of the output field effect transistor in response to a change in an optical signal.

According to the optical receiver according the present invention, the constant current source comprises a constant current supplying field effect transistor having one signal terminal connected to the gate terminal of the input field effect transistor, and an other signal terminal of the second power source via a resistance element; and a monitoring field effect transistor having the same characteristic as that of the constant current supplying field effect transistor; the monitoring field effect transistor having one signal terminal connected to a first power source via a resistance element and to the gate terminal of the constant current supplying field effect transistor; the monitoring field effect transistor having an other signal terminal and a gate terminal connected to the second power source.

An optical receiver according to the present invention, further comprises a fixed reference potential generator arranged in common to the plurality of the optical receiving processors, for producing a fixed reference potential as the predetermined standard reference potential to output to the limiter amplifiers in the optical receiving processors.

Furthermore, according to the present invention, the constant current source comprises a constant current supplying field effect transistor arranged in each of the optical receiving processors and having one signal terminal connected to the gate terminal of the input field effect transistor, and an other signal terminal connected to the second power source via a resistance element; and a monitoring field effect transistor having the same characteristic as that of the constant current supplying field effect transistor and arranged in common to the optical receiving processors; the monitoring field effect transistor having one signal terminal connected to the first power source via a resistance element and to the gate terminal of the constant current supplying field effect transistor; the monitoring field effect transistor having an other signal terminal and a gate terminal connected to the second power source.

According to the present invention, each of the optical receiving processors comprises a low level peak potential detector for detecting a low level peak potential of an output signal of the pre-amplifier; a high level peak potential detector having the same circuit configuration as the pre-amplifier, for detecting an output signal of the output field effect transistor as a high level peak potential of an output signal of the pre-amplifier when no input signal is inputted to the gate terminal of the input field effect transistor, the high level peak detector being arranged in common to said plurality of the optical receiving processors; and an average value detector arranged to each of the optical receiving processor, for averaging a low level peak potential detected by the low level peak potential detector and a high level peak potential detected by the high level peak potential detector and for outputting an average result as the predetermined standard reference potential to the limiter amplifier.

Furthermore, at least one of the plurality of the optical receiving processors receives a data signal of ½ mark ratio, and includes an average value detector for detecting an average value of an output signal of the pre-amplifier in the optical receiving processor, the output signal of the average value detector being used as the predetermined reference standard potential for the limiter amplifier in each of the plurality of the optical receiving processors.

According to the present invention, each of the optical receiving processors comprises an electric field absorption-type optical modulator for attenuating a received optical signal in accordance with a bias voltage and inputting it to said light receiving element; a standard reference potential generator for providing a center potential of an amplitude of the output signal as the predetermined standard potential based on an output signal from the pre-amplifier to the limiter amplifier; a comparison amplifier for comparing the predetermined reference potential with the output signal from the reference potential generator, outputting the deviation amplified as a bias voltage of the electric field absorption-type optical modulator, and controlling an attenuation amount of an optical signal by the electric field absorption-type optical modulator; and a standard potential generator arranged in common to the plurality of the optical receiving processors, for producing the predetermined standard potential to the comparison amplifier in each of the optical receiving processors.

According to the present invention, each of the optical receiving processors includes an electric field absorption-type optical modulator for attenuating a received optical signal in accordance with a bias voltage to input to the light receiving element, and at least one of the plurality of the optical receiving processors receives a data signal of ½ mark ratio and includes an average value detector for detecting an average value of an output signal from the pre-amplifier in each of the optical receiving processors, and each of the optical receiving processors includes an electric field absorption-type optical modulator for attenuating a received optical signal in accordance with a bias voltage and inputting it to the light receiving element; a comparison amplifier for comparing a predetermined standard potential with an output signal from the average value detector, outputting the deviation amplified as a bias voltage for the electric field absorption-type optical modulator; a standard potential generator for producing a predetermined standard potential to the comparison amplifier in each of the optical receiving processors; whereby the output signal from the comparison amplifier is used in common as a bias voltage for the electric field absorption-type optical modulator in each of the plurality of the optical receiving processors.

Furthermore, according to the optical receiver of the present invention, at least one of the plurality of the optical receiving processors receives a data signal of ½ mark ratio and includes an average value detector for detecting an average value of an output signal from the pre-amplifier in the optical receiving processors, and each of the optical receiving processors includes an electric field absorption-type optical modulator for attenuating a received optical signal in accordance with a bias voltage and inputting it to the light receiving element; a comparison amplifier for comparing a predetermined standard potential with an output signal from the average value detector, outputting the deviation amplified as a bias voltage for the electric field absorption-type optical modulator, and controlling an atenuation amount of an optical signal by the electric field absorption-type optical modulator; and a standard potential generator for producing the predetermined standard potential to the comparison amplifier in each of the optical receiving processors.

In this case, according to the present invention, the output signal from the average value detector is used in common as a predetermined reference potential for the limiter amplifier in each of the plurality of the optical receiving processors, and the data signal of ½ mark ratio is a clock signal.

An optical receiver according to the present invention comprises a light receiving element for converting a received optical signal into a current signal; a pre-amplifier for amplifying and outputting the current signal from the light receiving element into a predetermined voltage signal; a limiter amplifying the output signal from the pre-amplifier based on a predetermined standard reference potential; a differential amplifier for outputting potentials of one signal terminals of a pair of field effect transistors as a differential amplified result, the pair of field effect transistors having gate terminals for receiving respectively an output signal and an inverted output signal from the limiter amplifier, one signal terminals connected to a first power source via resistance elements, and other signal elements connected to a second power source; an ECL output buffer for receiving the output signal from the differential amplifier; and a constant current source arranged between the second power source and the other signal terminals of the pair of field effect transistors in the differential amplifier; the constant current source including a constant current supplying field effect transistor having one signal terminal connected to other signal terminals of the pair of field effect transistors and an other signal terminal connected to the second power source via a resistance element; and a monitoring field effect transistor for having the same characteristic as that of the constant current supplying field effect transistor; the one signal terminal of the monitoring field effect transistor being connected to the gate terminal of the constant current supplying field effect transistor and to the first power source via a resistance element; the other terminal and the gate terminal of the monitoring field effect transistor being connected to the second power source.

An optical receiver according to the present invention comprises a light receiving element for converting a received optical signal into a current signal; a pre-amplifier for amplifying and outputting the current signal from the light receiving element amplified into a predetermined voltage signal; a limiter amplifier for amplifying an output signal from the pre-amplifier based on a predetermined standard reference potential; and an electric field absorption-type optical modulator for attenuating the received optical signal in accordance with a bias voltage and inputting it to the light receiving element; the light receiving element and the electric field absorption-type optical modulator being integrally formed of two P-N junction formed elements on a same substrate.

Furthermore, an optical receiver according to the present invention comprises a plurality of optical receiving processors arranged in parallel, each including a light receiving element for converting a received optical signal into a current signal, a pre-amplifier for amplifying and outputting the current signal from the light receiving element amplified into a predetermined voltage signal, a limiter amplifier for amplifying an output signal from the pre-amplifier based on a predetermined standard reference potential, and an electric field absorption-type optical modulator for attenuating the received optical signal in accordance with a bias voltage and inputting it to the light receiving element; the electric field absorption-type optical modulator in each of the optical receiving processors being arranged between ribbon fibers receiving in parallel optical signals of plural channels; the plurality of electric field absorption-type optical modulators acting as a multi-channel optical attenuator integrally constituted in parallel with the same pitch of that of optical fibers of the ribbon fiber.

Therefore, according to the present invention, the optical receiving pre-amplifier includes a constant current source which enables no distorted waveforms due to an excessive input signal, a widened dynamic range, and a sufficient eye aperture. Thus each channel signal in the parallel transmission can be effectively controlled with common clocks. Since the circuit scale per channel is small, plural channels can be combined integrally on the same IC device.

Particularly, since the constant current source is constructed so as to compensate automatically a variation in the threshold voltage in accordance with the gate to source voltage of the constant current supplying FET, a constant drain current is supplied as a constant current without depending on the threshold voltage of the constant current supplying FET, whereby variations in the circuit characteristics of the pre-amplifier can be controlled certainly.

According to the optical receiver of the present invention, a pre-amplifier with high gain can be used for the constant current source. Since an error occurring in the standard reference potential generator providing a standard reference potential for the limiter amplifier is neglected, an adjustment-free device is realized, whereby the adjusting terminal can be removed and a reduced circuit scale and a low power consumption can be established.

Furthermore, the optical receiver according to the present invention can maintain the standard reference potential at a fixed value in the parallel transmission over a wide dynamic range, thus providing a sufficient eye aperture at all time. When the variation in the circuit characteristic is small, it is possible to realize the small-sized circuit, low power consumption, and reduced cost since no standard reference potential generator is required for each channel.

In the optical receiver including a differential amplifier and an ECL output buffer, the pre-amplifier can supply a desired constant current with small current value variation by arranging a constant current source which can compensate automatically the variation in threshold voltage with the gate to source voltage of a constant current supplying FET. Hence the pre-amplifier with the constant current source can suppress the gain variation, output amplitude variation, and output potential variation and is applied suitably to the ECL interface.

Moreover the circuit structure can be simplified remarkably by forming integrally the light receiving element and the electric field absorption-type optical modulator forming elements with two P-N junctions in the same substrate.

A plurality of optical receiving processors are arranged in parallel which a light receiving element, a pre-amplifier, a limiter amplifier, and an electric field absorption-type optical modulator, a multi-channel optical attenuator, which are formed integrally and in parallel with the same pitch as that of the optical fibers in a ribbon fiber, are arranged between the ribbon fibers, where the attenuation amounts of the optical signals in plural fibers can be advantageously controlled with a very simplified structure.

DESCRIPTION OF THE PREFERRED EMBODIMENTS

Referring to the attached drawings, an explanation will be made in detail as for preferred embodiments of the optical receiving pre-amplifier and the optical receiver using the same according to the present invention.

(a) Explanation of the principle of the invention

An explanation will be made below as for the principle of the present invention with reference to attached drawings.

Figure 1:
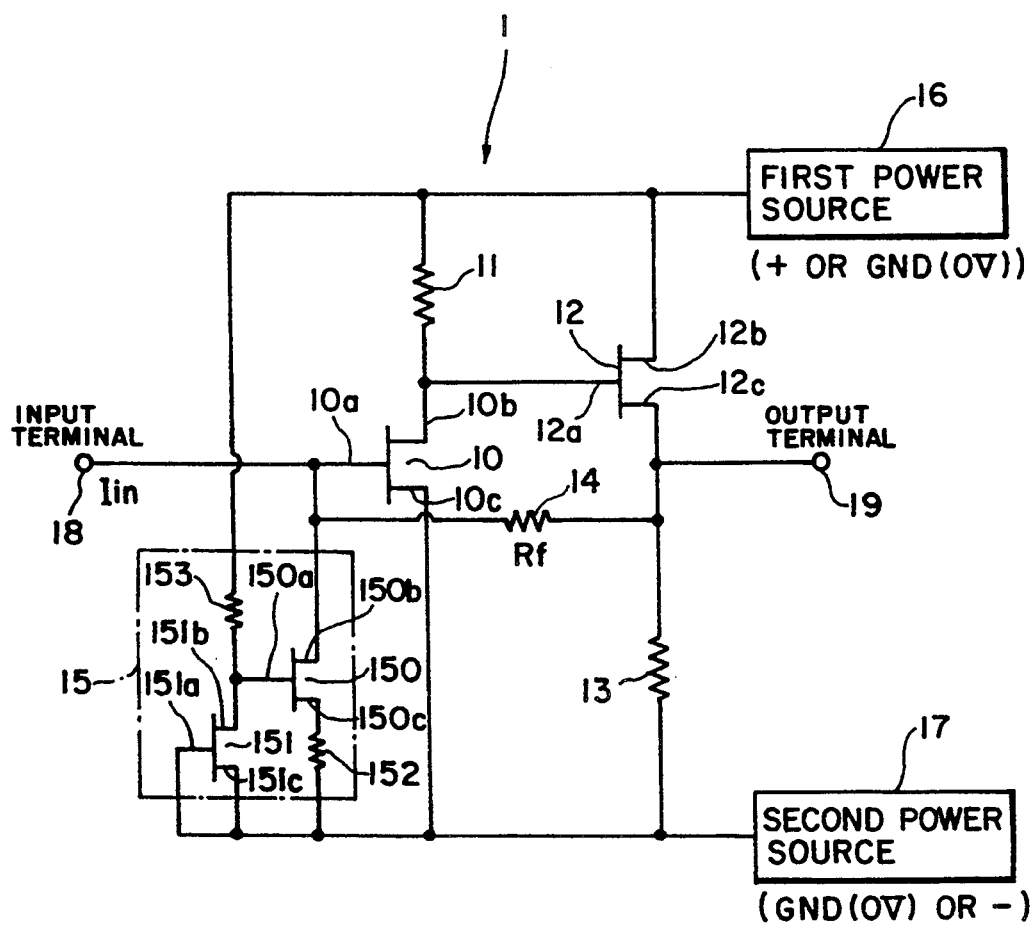
FIG. 1 is a principle block diagram showing an optical receiving pre-amplifier according to a first aspect of the present invention.

FIG. 1 is a block diagram showing the principle of the optical receiving pre-amplifier according to the first aspect of the present invention. In FIG. 1, according to the present invention, the optical receiving pre-amplifier 1 includes an input field effect transistor (hereinafter referred to FET) 10 has a gate terminal 10a for receiving via the input terminal 18 a current signal Iin converted from an optical signal by a light receiving element, one signal terminal (drain terminal) 10b connected to the first power source (positive power source Vdd or GND) 16 via the resistor 11, and the other signal terminal (source terminal) 10c connected to the second power source (GND or negative power source Vss) 17.

The output FET 12 has a gate terminal 12a connected to one signal terminal 10b of the input FET 10, one signal terminal (drain terminal) 12b connected to the first power source 16, and the other signal terminal (source terminal) 12c connected to the second power source 17 via a resistance element (functioning as a constant current source) 13, and amplifies a current signal Iin from a light receiving element to a predetermined voltage signal to output it to the output terminal 19 connected to the signal terminal 12c.

The feedback resistor (of resistance value Rf) 14 is arranged between the gate terminal 10a of the input FET 10 and the output terminal 19 of the output FET 12 and feeds the output signal of the output FET 12 back to the gate terminal 10a of the input FET 10.

A constant current source 15 is arranged between the gate terminal 10a of the input FET 10 and the second power source 17 and amplifies a change in the output potential amplitude of the output FET 12 to a change in the optical signal.

The constant current source 15 is formed of a constant current supplying FET 150 and the monitoring FET 151. The constant current supplying FET 150 has one signal terminal (drain terminal) 150b connected to the gate terminal 10a of the input FET 10 and the other signal terminal (source terminal) 150c connected to the second power source 17 via the resistance element 152.

The monitoring FET 151 has the same characteristic as that of the constant current supplying FET 150. The FET 151 has one signal terminal (drain terminal) 151b connected to the first power source 16 via the resistance element 153 and to the gate terminal 150a of the constant current supplying FET 150, and the other signal terminal (source terminal) 151c and to the gate terminal 151a connected to the second power source 17.

The gate terminal 151a of the monitoring FET 151 may be connected respectively to the first and second power sources 16 and 17 via the two resistors, and the other signal terminal 151c of the same may be connected to the second power source 17 via a resistance element. The gate terminal 151a of the monitoring FET 151 may be connected to the first power source 16 and the second power source 17 via a variable resistor, and the other signal terminal 151c of the same may be connected to the second power source 17 via a resistance element.

Figure 2:
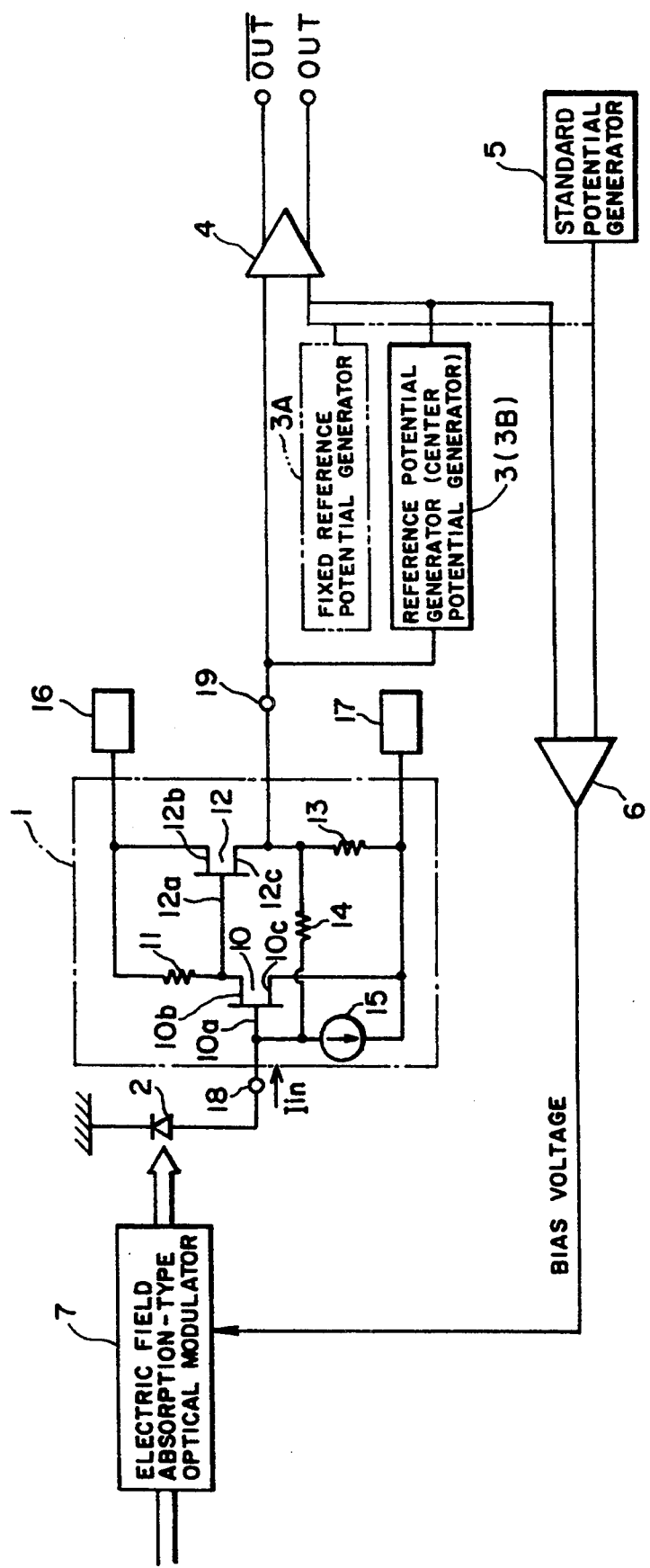
FIG. 2 is a principle block diagram showing an optical receiver according to a second aspect of the present invention.

FIG. 2 shows a structural diagram showing the configuration of the optical receiver according to a second aspect of the present invention. In FIG. 2, the pre-amplifier 1 amplifies a current signal Iin from a light receiving element 2 (described later) to a predetermined voltage signal. In the pre-amplifier 1, a constant current source 15 is arranged between the gate terminal 10a of the input FET 10 and the second power source 17.

Numeral 2 represents a light receiving element for converting a received optical signal into a current signal and for supplying it to the input terminal 18 of the pre-amplifier 1, 3 represents a standard reference potential generator, and 4 represents a limiter amplifier. The standard reference potential generator 3 produces a center potential amplitude of an output signal from the pre-amplifier 1 as a predetermined reference potential to the limiter amplifier 4. The limiter amplifier 4 amplifies the output signal from the pre-amplifier 1 based on the predetermined standard reference potential from the standard reference potential generator 3.

In the similar manner to that in FIG. 1, the pre-amplifier 1 according to the second aspect of the present invention is constituted of an input FET 10, a resistance element 11, an output FET 12, a resistance element 13, a feedback resistor 14, and a constant current source 15 arranged between the gate terminal 10a of the input FET 10 and the second power source 17 for amplifying a change in amplitude of an output potential of the output FET 12 in response to a change in an output signal.

The standard reference potential generator 3 is consisted of a high level peak potential detector for detecting a high level peak potential of an output signal from the pre-amplifier 1, a low level peak potential detector for detecting a low level peak potential of an output signal from the pre-amplifier 1, and an average value detector for averaging peak potentials detected by the above peak potential detectors and outputting the average result as a standard reference potential to the limiter amplifier 4.

The high level peak potential detector may be integrally formed with the pre-amplifier 1 and the output signal of the output FET 12 outputs as a high level peak potential to the average value detector when an input signal is not inputted to the gate terminal 10a of the input FET 10 in the high level peak potential detector.

When an optical signal adjusted by an automatic power adjuster on an optical transmission side is received, a fixed reference potential generator 3A which produces a fixed reference potential as a predetermined standard reference value to output to the limiter amplifier 4 may be used as the above mentioned standard reference potential generator.

The constant current source 15 in the pre-amplifier 1, as shown in FIG. 1, is constituted of a constant current supplying FET having one signal terminal connected to the gate terminal 10a of the input FET 10 and the other signal terminal connected to the second power source 17 via a resistance element, and a monitoring FET with the same characteristic as that of the constant current supplying FET, having one signal terminal connected to the gate terminal of the constant current supplying FET and to the first power source 16 via a resistance element, and the other signal terminal and the gate terminal connected to the second power source 17.

In FIG. 2, numeral 5 represents a standard potential generator, 6 represents a comparison amplifier, and 7 represents a electric field absorption-type optical modulator. The electric field absorption-type optical modulator 7 attenuates a received optical signal in accordance with a bias voltage and inputs it to the light receiving element 2. The comparison amplifier 6 compares the output signal of the average value detector acting as a standard reference potential generator 3 with a predetermined standard potential, amplifying the deviation to output it as a bias voltage for the electric field absorption-type optical modulator 7, and controlling the optical signal attenuation amount of the electric field absorption-type optical modulator 7. The standard potential generator 5 produces the predetermined reference potential to output to the pre-amplifier 6.

When the electric field absorption-type optical modulator 7 which attenuates a received optical signal in accordance with a bias voltage to output it to the light receiving element 2 is arranged, as shown with chain double-dashed lines in FIG. 2, the standard reference potential generator is formed as a fixed reference potential generator 3A to produce a fixed reference potential as a predetermined standard. reference potential to output to the limiter amplifier 4, and a center potential generator (or the standard reference potential generator 3) 3B is arranged to produce the center potential of the amplitude of an output signal from the pre-amplifier 1. The comparison amplifier 6 compares the output signal of the center potential generator 3B with a predetermined standard potential from the standard potential generator 5 and outputs the deviation amplified as a bias voltage for the electric field absorption-type optical modulator 7. The electric field absorption-type optical modulator 7 controls the attenuation amount of an optical signal. The fixed reference potential generator 3A may act as the reference potential generator 5.

Figure 3:
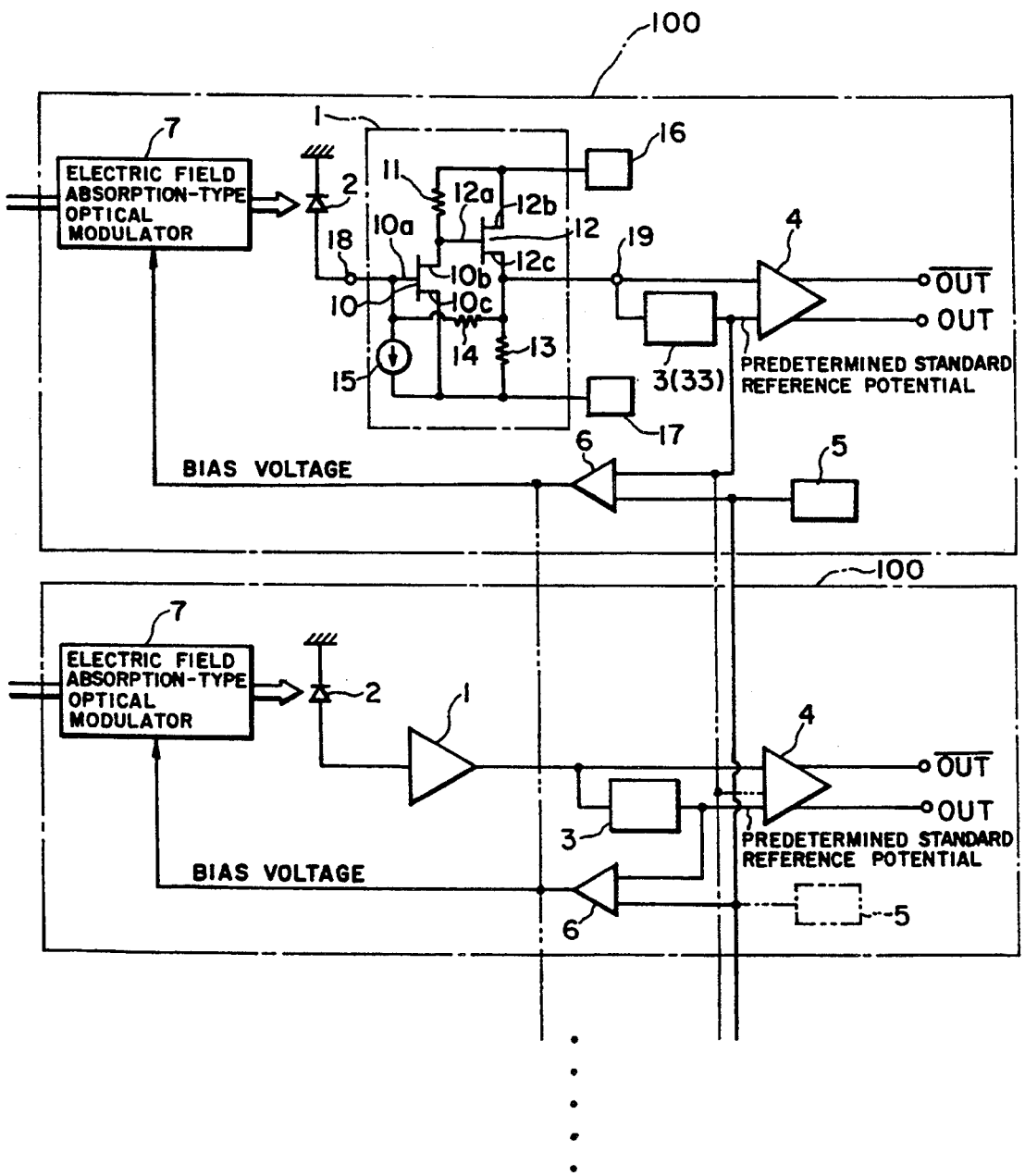
FIG. 3 is a principle block diagram showing an optical receiver according to a third aspect of the present invention.

FIG. 3 is a structural diagram showing the principle of the optical receiver according to the third aspect of the present invention. Referring to FIG. 3, the optical receiving processor 100 includes a light receiving element 2, a pre-amplifier 1, and a limiter amplifier 4. In this embodiment, plural optical receiving processors are arranged in parallel. The pre-amplifier 1 in the optical receiving processor 100 includes a constant current source 15 arranged between the gate terminal 10a of the input FET 10 and the second power source 17, like those in FIGS. 1 and 2.

The constant current source 15, as described with FIG. 1, is formed of a constant current supplying FET having one signal terminal connected to the gate terminal 10a of the input FET 10 and the other signal terminal connected to the second source 17 via a resistance element, a monitoring FET with the same characteristic as that of the constant current supplying FET and having one signal terminal connected to the first power source 16 via a resistance element and the gate terminal of the constant current supplying FET and the other signal terminal and the gate terminal connected to the second power source 17. When the constant current source 15 is arranged, a fixed reference potential generator which produces fixed reference potential as a predetermined potential to the limiter amplifier 4 in each optical receiving processor 100 may be shared with plural optical receiving processor 100.

The constant current source 15 is constituted of a constant current supplying FET arranged in each of the optical receiving processors 100 and having one signal terminal connected to the gate terminal 10a of the input FET 10 and an other signal terminal connected to the second power source 17 via a resistance element, and a monitoring FET with the same characteristic as that of the constant current supplying FET and being in common to the optical receiving processors 100. The monitoring FET has one signal terminal connected to the first power source 16 via a resistance element and to the gate terminal of the constant current supplying FET, and the other signal terminal and a gate terminal connected to the power source 17.

The low level peak detector for detecting a low level peak potential of the output signal from the pre-amplifier 1 is arranged in each of the optical receiving processors 100. When having the similar circuit configuration to the pre-amplifier 1 and receiving no input signal to the gate terminal of the input FET, the high level peak potential detector for detecting the output signal of the output FET as a high level potential of the output signal from the pre-amplifier 1 is arranged in common to the plural optical receiving processors 100. In each of the optical receiving processors 100 is arranged the average value detector which averages a low level peak potential detected by each of the low level peak potential detectors and a high level peak potential detected by the common high level peak potential detector and then outputs the averaged result as a predetermined standard reference potential to the limiter amplifier 4.

At least one (for example, the upmost optical receiving processor in FIG. 3) of the optical receiving processors 100 receiving a data signal of ½ mark ratio includes an average detector 33 for detecting the average of the output signal from the pre-amplifier 1 in the optical receiving processor 100. The output signal from the average value detector 33 can be used in common as a predetermined standard reference potential for the limiter amplifiers 4 in the plural optical receiving processors 100. The clock signal can be used as a data signal of ½ mark ratio.

As shown in FIG. 3, the optical receiving processor 100 includes an electric field absorption-type optical modulator 7 for attenuating a received optical signal in accordance with a bias voltage and inputting it to the light receiving element 2, a standard reference potential generator 3 for producing the center potential of an output signal amplitude from the pre-amplifier 1 to the limiter amplifier 4, and a comparison amplifier 6 for comparing the output signal from the standard reference potential generator 3 with a predetermined standard potential, outputting the deviation amplified as a bias voltage for the electric field absorption-type optical modulator 7, and controlling the attenuation amount of an optical signal by the electric field absorption-type optical modulator 7. The standard potential generator 5 which produces a predetermined standard potential to the comparison amplifier 6 in each of the optical receiving processors 100 may be arranged in common to the plural optical receiving processors 100.

As shown in FIG. 3, the optical receiving processor 100 includes an electric field absorption-type optical modulator 7 for attenuating a received signal in accordance with a bias voltage and inputting it to the light receiving element 2. At least one (for example, the upmost optical receiving processor in FIG. 3) of optical receiving processors 100 where a data signal of ½ mark ratio is inputted includes an average value detector 33 for detecting an average value of the output signal from the pre-amplifier 1 in the optical receiving processor 100, a comparison amplifier 6 for comparing the output signal from the average value detector 33 with the standard potential, outputting the deviation amplified as a bias voltage for the electric field absorption-type optical modulator 7, and controlling the attenuation amount of an optical signal by the electric field absorption-type optical modulator 7, a standard potential generator 5 for producing a predetermined standard potential to the comparison amplifier 6. The output signal from the comparison amplifier 6 can be used in common as a bias voltage for the electric field absorption-type optical modulator 7 in the plural optical receiving processors 100.

The output signal of the average value detector 33 can be used in common as a predetermined standard reference potential for the limiter amplifier 4 in the plural optical receiving processors 100. The clock signal can be used as the data signal of ½ mark ratio.

Moreover, at least one (for example, the upmost optical receiving processor 100 in FIG. 3) of the optical receiving processors 100, where a data signal of ½ mark ratio is inputted, includes an average value detector 33 for detecting the average value of an output signal from the pre-amplifier 1 in the optical receiving processor 100. The optical receiving processor 100 may be consisted of an electric field absorption-type optical modulator 7 for attenuating a received optical signal based on a bias voltage and inputting it to the light receiving element 2, a comparison amplifier 6 for comparing the output signal from the average value detector 33 with a predetermined standard potential, outputting the deviation amplified as a bias voltage for the electric field absorption-type optical modulator 7, and controlling the attenuation amount of an optical signal by the electric field absorption-type optical modulator 7, and a standard potential generator 5 for producing a predetermined standard potential to the comparison amplifier 6 in the optical receiving processor 100.

The output signal from the average value detector 33 is used in common as a predetermined standard reference potential of the limiter amplifier 4 in the plural optical receiving processors 100. The clock signal may be used as a data signal of ½ mark ratio.

Figure 4:
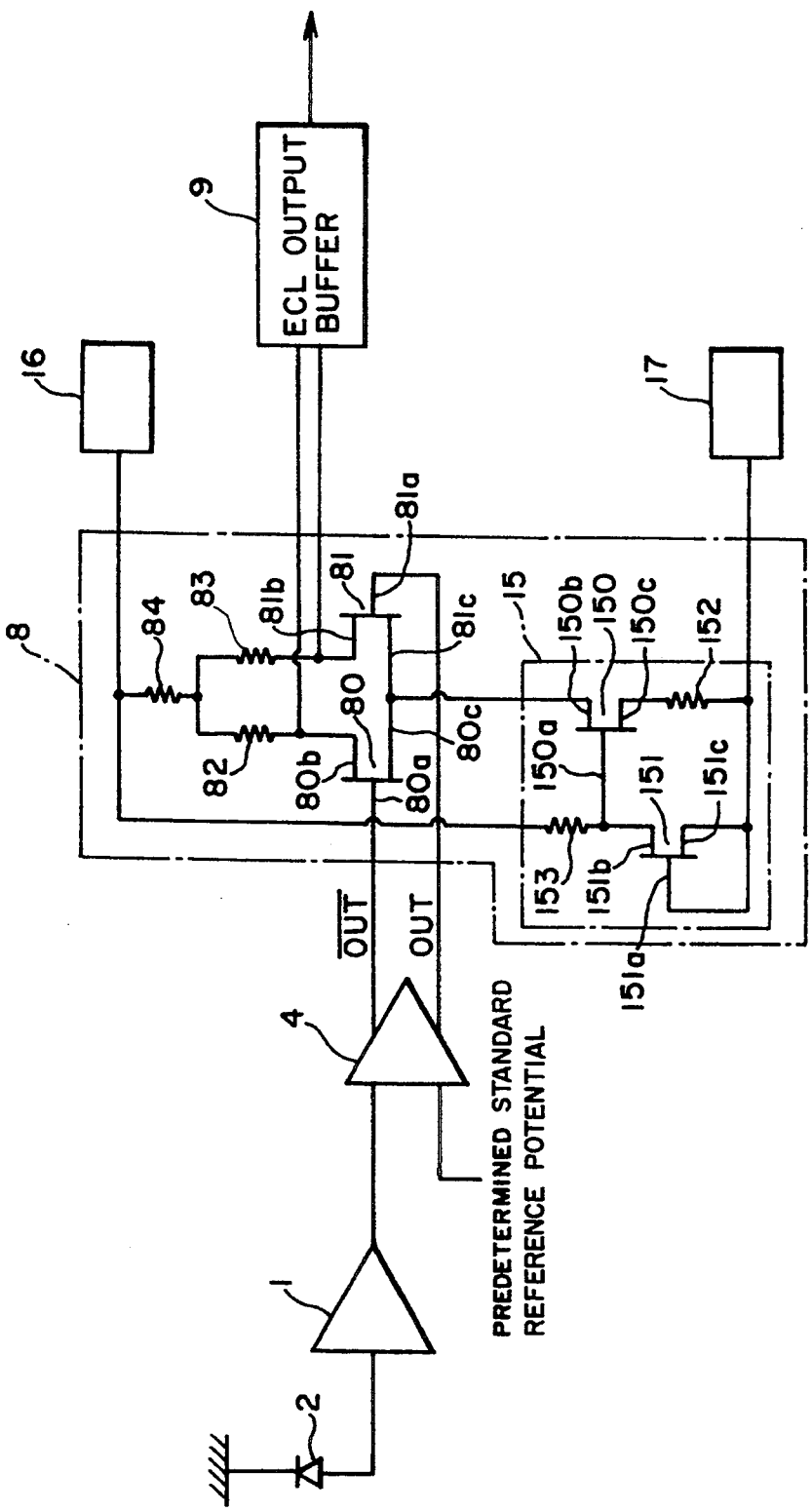
FIG. 4 is a principle block diagram showing an optical receiver according to a fourth aspect of the present invention.

FIG. 4 is a structural diagram showing the principle of the optical receiver according to the fourth aspect of the present invention. Referring to FIG. 4, this embodiment includes a light receiving element 2, a pre-amplifier 1 and a limiter amplifier 4. A differential amplifier 8 and an ECL (Emitter Coupled Logic) output buffer 9 are arranged to the rear stage of the limiter amplifier 4.

The differential amplifier 8 includes a pair of FETs 80 and 81 having gate terminals 80a and 81a receiving the output signal and the reverse output signal of the limiter amplifier 4, respectively, one signal terminals (drain terminals) 80b and 81b connected to the first power source (positive power source Vdd or GND) 16 via the resistance elements 82 to 84, respectively, and the other terminals (source terminals) 80c and 81c connected to the second power source (GND or negative power source Vss) 17. The potentials of the one signal terminals 80b and 81b of the pair of FETs 80 and 81 are outputted as differential amplified results. The ECL output buffer 9 operates in response to the output signal from the differential amplifier 8.

A constant current source 15 is arranged between the other signal terminals 80c and 81c and the second power source 17 of the pair of the FETs 80 and 81 in the differential amplifier 8. The constant current source 15, in the similar manner to that in FIG. 1, is formed of a constant current supplying FET 150 and a monitoring FET 151. The constant current supplying FET 150 has one signal terminal (drain terminal) 150b connected to the other signal terminals of the pair of the FETs 80 and 81 and other signal terminal (source terminal) 150c connected to the second power source 17 via a resistance element 152.

The monitoring FET 151 has the same characteristic as that of the constant current supplying FET 150. The FET 150 has one signal terminal (drain terminal) 151b connected to the first power source 16 and to the gate terminal 150a of the constant current supplying FET 150 via a resistance element 153, and the other signal terminals (source terminal) 151c and a gate terminal 151a connected to the second power source 17.

The optical receiver according to the fifth aspect of the present invention has a nearly similar circuit structure to that shown in FIG. 2. The optical receiver is constituted of a light receiving element 2 for converting a received optical signal into a current signal, a pre-amplifier I for amplifying the current signal from the light receiving element 2 to a predetermined voltage signal, a limiter amplifier 4 for amplifying an output signal from the pre-amplifier 1 based on a predetermined standard reference potential, and an electric field absorption-type optical modulator 7 for attenuating the received optical signal in accordance with a bias voltage and inputting it to the light receiving element 2. The light receiving element 2 and the electric field absorption-type optical modulator 7 are integrally formed with two P-N junctions on the same substrate.

The optical receiver according to the sixth aspect of the present invention has a plurality of optical receiving processors 100 arranged in parallel each of which a nearly similar circuit structure to that shown in FIG. 3. The optical receiver is constituted of a light receiving element 2 for converting a received optical signal into a current signal, a pre-amplifier 1 for amplifying and outputting the current signal from the light receiving element 2 to a predetermined voltage, a limiter amplifier 4 for amplifying the output signal from the pre-amplifier 1 based on a predetermined standard reference potential, and an electric field absorption-type optical modulator 7 for attenuating the received optical signal in accordance with a bias voltage and inputting it to the light receiving element 2. The electric field absorption-type optical modulator 7 of the optical receiving processor 100 is arranged between the ribbon fibers where plural channel optical signals are inputted in parallel. The plural electric field absorption-type optical modulator is formed as a multi-channel optical attenuator which is integrally formed in parallel with the same pitch as the optical fibers in the ribbon fiber.

In the optical receiving pre-amplifier according to the first aspect of the present invention, the current Ics from the constant current source 15 arranged between the gate terminal 10a of the input FET 10 and the second power source (negative power source Vss or GND) 17 flows only through the feedback resistor 14 but not toward the input terminal 18 side. Hence the voltage component (Ics×Rf) increases the dc voltage of the output terminal 19 which is maximized at no current signal Iin from the light receiving element to the input terminal 18.

Figure 5:
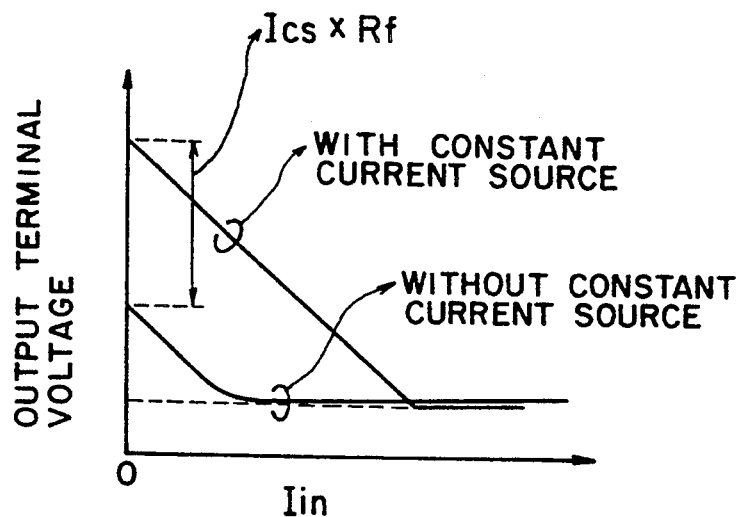
FIG. 5 is a graph showing the input/output characteristics of an optical receiving pre-amplifier according to the first aspect of the present invention.

FIG. 5 shows the characteristic of the potential of the output terminal 19 with respect to the input current Iin in the circuit with the constant current source 15 and the characteristic of the conventional circuit with no constant current source. As shown in FIG. 5, the constant current source 15 does not saturate even if the input current Iin is large. As a result, even if the optical signal power is excessive, the pre-amplifier 1 does not produce an output signal with a distorted waveform due to saturation, thus providing enlarged dynamic range and sufficient eye aperture.

The constant current source 15 includes a constant current supplying FET 150 for supplying a desired constant current Ics as a drain current and a monitoring constant current FET 151 having the same characteristic as that of the constant current supplying FET 150. A variation in the threshold voltage is monitored from the variation in the drain current Id flowing through the monitoring FET 151 to equalize an increase in the threshold voltage with and a decrease in the gate to source voltage of the constant current supplying FET 150 so that the threshold voltage variation can be cancelled. The variation in the threshold voltage can be compensated automatically by the voltage between the gate terminal and the source terminal of the constant current supplying FET 150. Thus a constant drain current can be supplied as a desired constant current Ics without depending on the threshold voltage of the constant current supplying FET 150. The potential of the gate terminal 150a of the constant current supplying FET 151 or the voltage between the gate terminal and the source terminal of the constant current supplying FET 150 can be adjusted by adjusting properly the potential of the gate terminal 151a of the monitoring FET 151 to a proper value by two resistance elements or a variable resistor, thus suppressing a variation in the drain current of the constant current supplying FET 150 to a variation in the power source voltage.

In the optical receiver according to the second aspect of the present invention, after a current signal from the light receiving element 2 is amplified to a predetermined voltage signal by the pre-amplifier 1, the output signal from the pre-amplifier 1 is amplified by the limiter amplifier 4 based on a predetermined standard reference potential from the standard reference potential generator 3. In this case, the pre-amplifier 1 is formed as that of the first aspect of the present invention shown in FIG. 1. Even if the optical signal power is excessive, the pre-amplifier 1 does not produce its output waveform with distorted waveform due to saturation, thus providing the enlarged dynamic range as shown in FIG. 5 comparing with the conventional one.

In the standard reference potential generator 3, when the average value detector detects an average value between the output of the high level peak potential detector and the output of the low level peak potential detector or the center potential of the amplitude of the output from the pre-amplifier 1 to output as a predetermined reference potential to the limiter amplifier 4, since the pre-amplifier 1 has a wide dynamic range, the input level of the signal from the pre-amplifier 1 to the standard reference potential generator 3 is sufficiently large. Therefore even if an error occurs in the standard reference potential generator 3, the error ratio to the input level is sufficiently small, whereby the standard reference potential generator 3 can provide accurately a predetermined standard reference potential.

The high level peak potential detector is integrally formed with the pre-amplifier 1. When no input signal is inputted to the gate terminal 10a of the input FET 10, the output signal of the output FET 12 is maximized as shown in FIG. 5 and is inputted as a high level peak potential to the average value detector of the standard reference potential generator 3.

In the optical receiver of the present invention, when an optical signal power-adjusted by an automatic power adjusting circuit on the optical transmission side is received, the received optical signal becomes relatively small in power variation because the optical power from the optical transmission side is constant. Therefore, the accuracy can be maintained even if a fixed potential is used as a predetermined stanard reference potential, whereby it is unnecessary to make continuously a predetermined standard reference potential for the limiter amplifier 4 based on the output signal from the pre-amplifier 1. In this case, the fixed reference potential generator 3A can be used as a standard reference potential generator to produce a fixed reference potential to the limiter amplifier 4 so that the predetermined standard reference potential is used as the fixed reference potential.

Since the constant current source 15, shown in FIG. 1, which is formed of a constant current FET and a monitoring FET may be used as the constant current source in the pre-amplifier 1, a constant drain current can be supplied as a desired constant current without depending on the threshold voltage of the constant current supplying FET.

Figure 6:
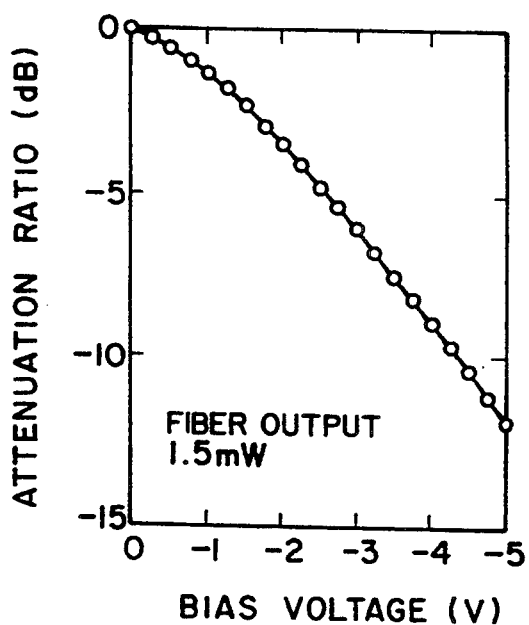
FIG. 6 is a graph showing an electric field absorption-type optical modulator of the present invention.

In the optical receiver shown in FIG. 2, the electric field absorption-type optical modulator 7 has the characteristic shown in FIG. 6 and varies the attenuation amount of a received optical signal in accordance with a applied bias voltage. The optical signal from the electric field absorption-type optical modulator 7 is converted into an electric signal by the light receiving element 2. The pre-amplifier 1 amplifies the electric signal to input the result to the limiter amplifier 4. At the same time, the standard reference potential generator 3 detects the center potential of the amplitude of an output signal from the pre-amplifier 1 to supply as a predetermined standard reference potential to the limiter amplifier 4.

The reference potential from the standard reference potential generator 3 is compared with the reference potential from the standard potential generator 5 in the comparison amplifier 6. The resultant output controls the attenuation amount of the optical signal in the electric field absorption-type optical modulator 7. By controlling the electric field absorption-type optical modulator 7 so as to make large the attenuation amount of the electric field absorption-type optical modulator 7 when the optical power is large and to make small the attenuation amount of the electric field absorption-type optical modulator 7 when the optical power is small, the standard reference potential is maintained nearly constant (at a standard potential from the standard potential generator 5).

When the standard potential generator 5, the comparison amplifier 6, and the electric field absorption-type optical modulator 7 are arranged, the center potential generator (the same configuration as the standard reference potential generator 3) 3B produces the center potential of the amplitude of the output signal from the pre-amplifier 1. The output signal from the comparison amplitude 6 can control the attenuation amount of the optical signal in the electric field absorption-type optical modulator 7 so as to maintain the center potential at a predetermined standard potential from the standard potential generator 5.

With such a control, since the power variation of the optical signal received by the light receiving element 2 is relatively small, a fixed reference potential can be used as a predetermined standard reference potential, without producing continuously a predetermined standard reference potential for the limiter amplifier 4 based on the output signal from the pre-amplifier I and without using the automatic power adjusting circuit on the optical transmission side. Hence the fixed reference potential can be used as a predetermined standard reference potential by using the fixed reference potential generator 3A as a standard reference potential generator for producing a fixed reference potential to output to the limiter amplifier 4. In this case, the fixed reference potential generator 3A can be used as the standard potential generator 5, thus realizing a simplified circuit configuration.

In the optical receiver according to the third aspect of the present invention, a plurality of optical receiving processors 100 each which is formed of a light receiving element 2, a pre-amplifier 1, and a limiter amplifier 4 are arranged in parallel, and can receive in parallel optical signals in plural channels. The pre-amplifier 1 in each of the optical receiving processors 100, as shown in FIG. 1, has the similar configuration as that of the first aspect of the present invention. Even if the optical signal power is excessive, the output waveform of the pre-amplifier 1 does not occur any distorted waveform due to saturation. Thus as shown in FIG. 5, the dynamic range of the pre-amplifier 1 in the optical receiving processor 100 is widened largely, comparing to the conventional one.

When the constant current source 15 formed of a constant current supplying FET and a monitoring FET, as shown in FIG. 1, is used in the pre-amplifier 1, the optical receiving processor 100 can supply a constant drain current as a desired current without depending on the threshold potential of the constant current supplying FET. The constant current source 15 decreases a variation in the output potential of the pre-amplifier 1 in the optical receiving processor 100. Hence the fixed reference potential generator can be used in common for the plural optical receiving processors 100 and produces a fixed reference potential as a predetermined standard reference potential to the limiter amplifiers 4 in the optical receiving processors 100.

The constant current source 15 also may be formed of a constant current supplying FET provided for each of the optical receiving processors 100 and a monitoring FET shared by plural optical receiving processors 100. Hence a constant drain current can be supplied as a predetermined constant current without depending on the threshold voltage of the constant current supplying FET and the shared monitoring FET can simplify further the circuit structure.

In order to produce a predetermined standard reference potential to the limiter amplifier 4, a low level peak potential detector and an average value detector are arranged to each of the optical receiving processors 100 and the common high level peak potential detector (formed together with the pre-amplifier 1 and having an input FET of the gate terminal 10a is in no input signal) is arranged to the plural optical processors 100. The average value detector detects the average value of the output of the low level peak potential detector and the output of the common high level peak potential detector (or the center potential of the output signal amplitude of the pre-amplifier 1) in each of the optical receiving processors 100 to output the potential as a predetermined standard reference potential to the limiter amplifier 4.

The high level peak potential detector is used in common and simplifies the circuit structure and the pre-amplifier 1 in each of the optical receiving processors 100 has wider dynamic range than that of the conventional one. Since the input level of the signal from the pre-amplifier 1 to the low level peak potential circuit is sufficiently large, the input level to error ratio is negligible even if an error occurs in the low level peak potential detector, whereby a predetermined standard reference potential can be obtained accurately.

When the optical receiving processor 100 receiving a data signal of $\frac{1}{2}$ mark ratio is used, an average value detector 33 which detects the average value of the output signal of the pre-amplifier 1 is arranged in the optical receiving processor 100. Thus the output signal of the average value detector 33 is used in common as a predetermined standard reference potential for the limiter amplifier 4 in plural optical receiving processors 100 so that the circuit structure of other optical receiving processors 100 can be simplified more.

In this case, when the optical signals of plural channels are received in parallel to process them, an optical receiving processor 100 which receives a clock signal to process is usually prepared for at least one of channels. The clock signal is a data signal of $\frac{1}{2}$ mark ratio. When the clock signal is used to produce a predetermined standard reference potential by the average value detector 33, it is unnecessary to arrange additionally an optical receiving processor 100 for receiving a data signal of $\frac{1}{2}$ mark ratio and for producing a predetermined standard reference potential.

The optical receiver shown in FIG. 3 includes an electric field absorption-type optical modulator 7 in each of the optical receiving processors 100. An optical signal outputted from the electric field absorption-type optical modulator 7 is converted to an electrical signal by the light receiving element 2, amplified by the pre-amplifier 1, and inputted to the limiter amplifier 4. The standard reference potential generator 3 detects the center potential of the amplitude of the output signal from the pre-amplifier 1 and the limiter amplifier 4 supplies it as a predetermined standard reference potential to the limiter amplifier 4.

In each of the optical receiving processors 100, the the comparison amplifier 6 compares the reference potential from the standard reference potential generator 3 with the standard potential from the standard potential generator 5 used in common for all the optical receiving processors 100. The resultant output controls the attenuation amount of an optical signal in the electric field absorption-type optical modulator 7 to maintain usually the standard reference potential to a nearly fixed value.

When the optical receiving processor 100 for receiving a data signal of $\frac{1}{2}$ mark ratio is arranged, the average value detector 33 detects the average value of the output signal from the pre-amplifier 1, the comparison amplifier 6 compares the output signal from the average value detector 33 with a predetermined standard potential from the standard potential generator 5, amplifies the deviation, and outputs it as a bias voltage for the electric field absorption-type optical modulator 7. Thus the attenuation amount of an optical signal of the electric field absorption-type optical modulator 7 is controlled. The output of the comparison amplifier 6 is used in common as a bias voltage for the electric field absorption-type optical modulator 7 in other optical receiving processors 100 to control the attenuation amount of an optical signal by the electric field absorption-type optical modulator 7. As a result, the circuit structure of other optical receiving processors 100 can be simplified more.

Using in common the output signal from the average value detector 33 as a predetermined standard reference potential for the limiter amplifier 4 in the optical receiving processors 100 leads to a further simplification of the circuit structure of the optical receiving processors 100. As described above, the use of the clock signal as a data signal of $\frac{1}{2}$ mark ratio eliminates an additional optical receiving processor 100 for receiving a data signal of $\frac{1}{2}$ mark ratio.

Furthermore, when the optical receiving processor 100 for receiving a data signal of $\frac{1}{2}$ mark ratio is arranged, the average value detector 33 detects the average value of the output from the pre-amplifier 1, the comparison amplifier 6 compares the output signal from the average value detector 33 with a predetermined standard potential from the standard potential generator 5, amplifies the deviation and outputs it as a bias voltage for the electric field absorption-type optical modulator 7 to control the attenuation amount of an optical signal by the electric field absorption-type optical modulator 7. Thus in each of the optical receiving processors 100, the comparison amplifier 6 can adjust suitably the predetermined standard potential compared with the output signal from the average value detector 33.

Since the output of the average value detector 33 is used in common as a predetermined standard reference potential for the limiter amplifier 4 in the optical receiving processors 100, the circuit configuration can be simplified. The use of the clock signal as a data signal of $\frac{1}{2}$ mark ratio can omit an additional optical receiving processor 100 for receiving a data signal of $\frac{1}{2}$ mark ratio.

The above optical receiver according to the fourth aspect of the invention includes a light receiving element 2, a pre-amplifier 1, and a limiter amplifier 4. A differential amplifier 8 and an ECL output buffer 9 are arranged rear to the limiter amplifier 4. In the differential amplifier 8, a constant current source 15 is arranged between the other signal terminals 80c and 81c of a pair of FETs 80 and 81 and the second power source 17, in the similar manner to that shown in FIG. 1.

The constant current source 15 compensates automatically the threshold voltage variation based on the gate to source voltage of the constant current supplying FET 150 to supply a desired constant current Ics with a small current variation, thus suppressing the gain variations, output amplitude variations, and output potential variations of the differential amplifier 8.

The optical receiver according to the fifth aspect of the present invention has the similar structure to that shown in FIG. 2. The light receiving element 2 and the electric field absorption-type optical modulation 7 are integrally formed of two P-N junctions formed in the same substrate to realize the miniaturized circuit structure and the reduced manufacturing cost.

The optical receiver according to the sixth aspect of the invention includes a plurality of optical receiving processors 100 arranged in parallel each which is consisted of a light receiving element 2, a pre-amplifier 1, a limiter amplifier 4, and an electric field absorption-type optical modulator 7. The attenuation amounts of optical signals in plural channels can be controlled in parallel in a simplified structure, by arranging a multichannel optical attenuator (plural electric field absorption-type optical modulator 7) integrally formed in parallel and with the same pitch as that of optical fibers arranged between ribbon fibers.

Since the optical receiving pre-amplifier of the present invention includes a constant current source, even if the input signal is excessive, it is possible to realize no distorted waveform, a prevention of saturation occurrence, and a widened dynamic range. Thus the sufficient eye aperture obtained is effective to operate channel signals in the parallel transmission with common clocks. Moreover the small-sized circuit scale per channel can combine plural channels in parallel within the same IC.

Particularly, the constant current source, which is formed so as to compensate automatically the variations in threshold voltage based on the gate to source voltage of the constant current supplying FET, can supply a constant drain current as a desired constant current without depending on the threshold voltage of the constant current supplying FET, thus suppressing certainly the variations in the circuit characteristics of the pre-amplifier.

According to the present invention, the pre-amplifier with a constant current source has a high gain and can eliminate an error occurring in the standard reference potential generator for providing a standard reference potential for the limiter amplifier. Hence an adjustment-free operation can be realized by removing the adjusting terminals while a reduced circuit scale and low power consumption can be realized.

Moreover, according to the present invention, a standard reference potential can be maintained at a fixed value in a wide dynamic range in the parallel transmission and can obtain usually a sufficient wide aperture. In the case of a small variation in the circuit characteristics, it is unnecessary to arrange a standard reference potential generator per channel, whereby the small-sized circuit, low power consumption, and low cost can be realized.

In the optical receiver having a differential amplifier and an ECL output buffer, a desired constant current with small variation can be supplied to the differential amplifier because of a constant current source which can compensate automatically the variation in the threshold voltage in accordance with the gate to source voltage of the constant current supplying FET. The constant current source can suppress the gain variations, the output amplitude variations and the output potential variations of the differential amplifier, and optimizes for the ECL interface.

Furthermore, since a light receiving element and an electric field absorption-type optical modulator are integrally formed with two P-N junctions on the same substrate, the circuit structure can be miniaturized considerably and the manufacturing cost can be reduced.

When the optical receiving processors each which includes a light receiving element, a pre-amplifier, a limiter amplifier, and an electric field absorption-type optical modulator are arranged in parallel, the optical signal of plural channels can be effectively attenuated in parallel by a very simplified structure, by arranging a multi-channel optical attenuator integrally formed in parallel with the same pitch as optical fibers in a ribbon fiber between ribbon fibers.

(b) Explanation of the First Embodiment

The embodiment of the present invention will be explained below with reference to the attached drawings.

Figure 7:
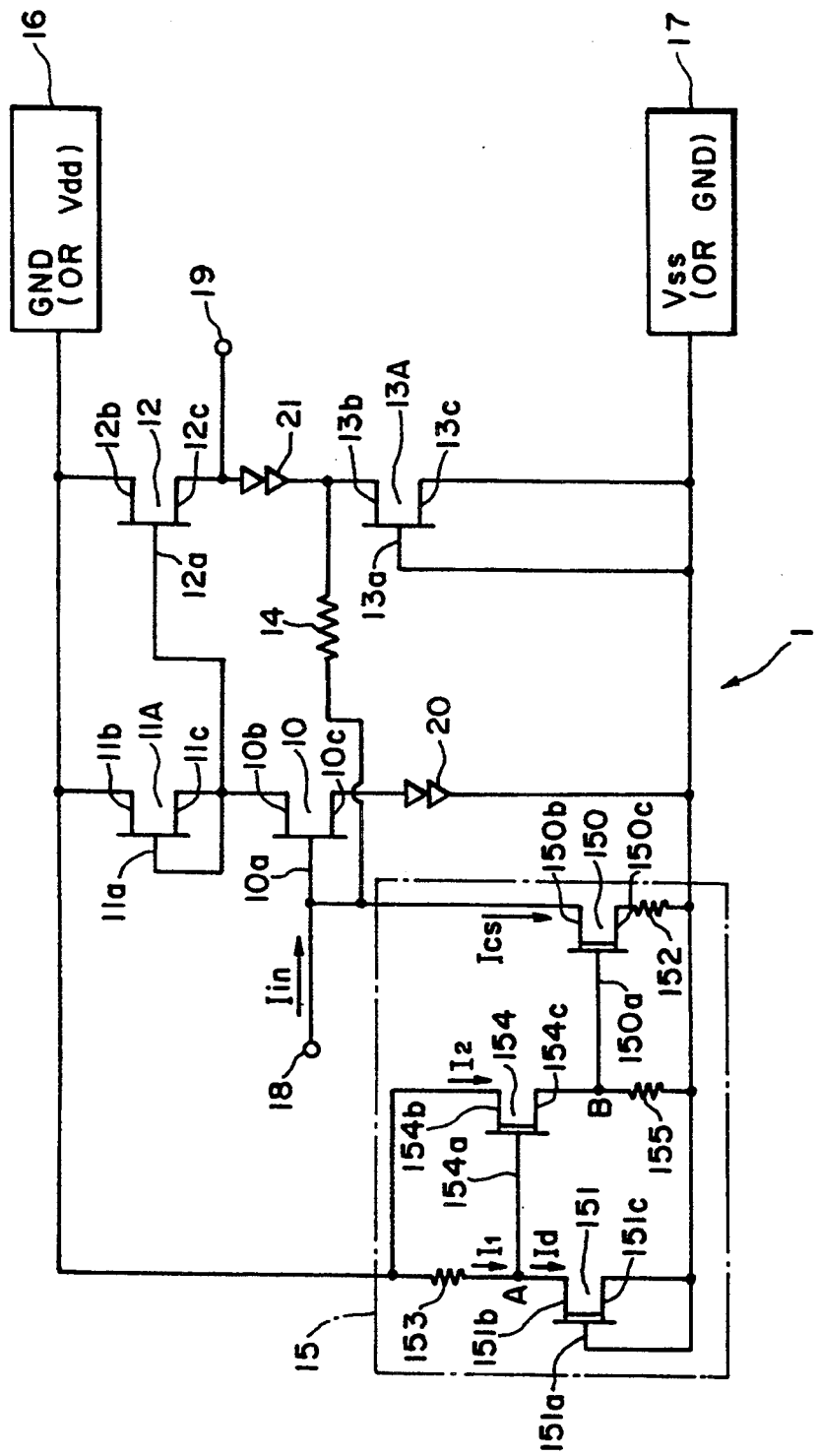
FIG. 7 is a circuit diagram showing an optical receiving pre-amplifier according to the first embodiment of the present invention.
Figure 8:
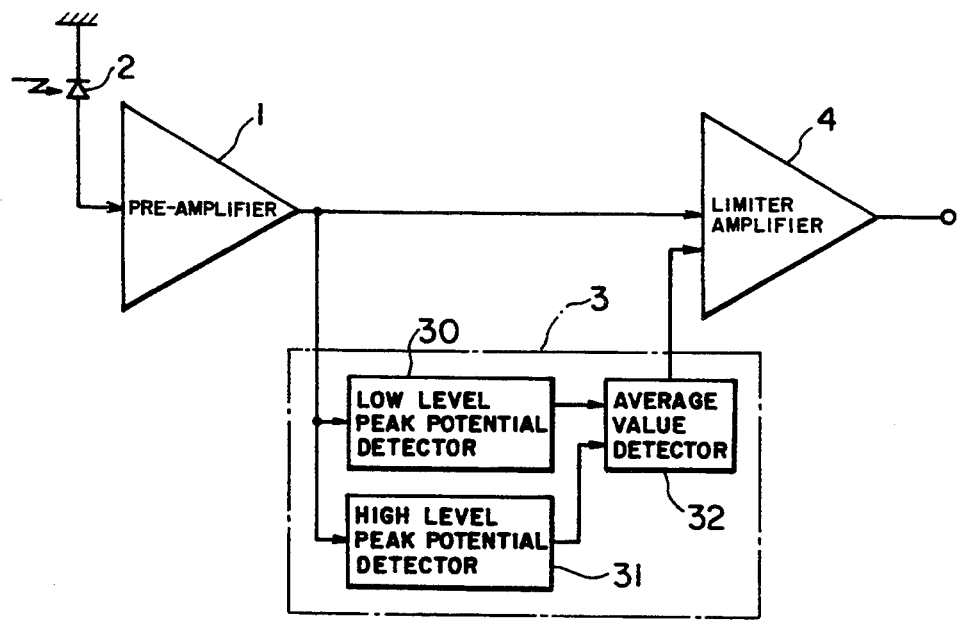
FIG. 8 is a block diagram showing an optical receiver according to the first embodiment of the present invention.

FIG. 7 is a circuit diagram showing an optical receiving pre-amplifier according to the first embodiment of the present invention. FIG. 8 is a block diagram showing an optical receiver according to the second embodiment of the present invention.

Referring to FIG. 8, numeral 1 represents a trans impedance-type pre-amplifier for receiving, explained later with FIG. 7. The pre-amplifier 1 amplifies and outputs to a predetermined voltage signal a current signal Iin obtained by converting an optical signal by the light receiving element 2 (photoelectric converting element such as photo-diode).

Numeral 3 represents a standard reference potential generator for detecting and producing the center potential of the output signal amplitude from the pre-amplifier 1 as a predetermined standard reference potential. The standard reference potential generator 3 is formed of a low level peak potential detector 30 for the low level peak potential of an output signal from the pre-amplifier 1, a high level peak potential detector 31 for detecting a high level peak potential of an output signal from the pre-amplifier 1, and an average value detector 3c for averaging peak potentials detected by the detectors 30 and 31, and outputting the averaged result as a predetermined standard reference potential.

The limiter amplifier 4 amplifies the output signal from the pre-amplifier 1 based on the standard reference potential from the standard reference potential generator 3.

Figure 31:
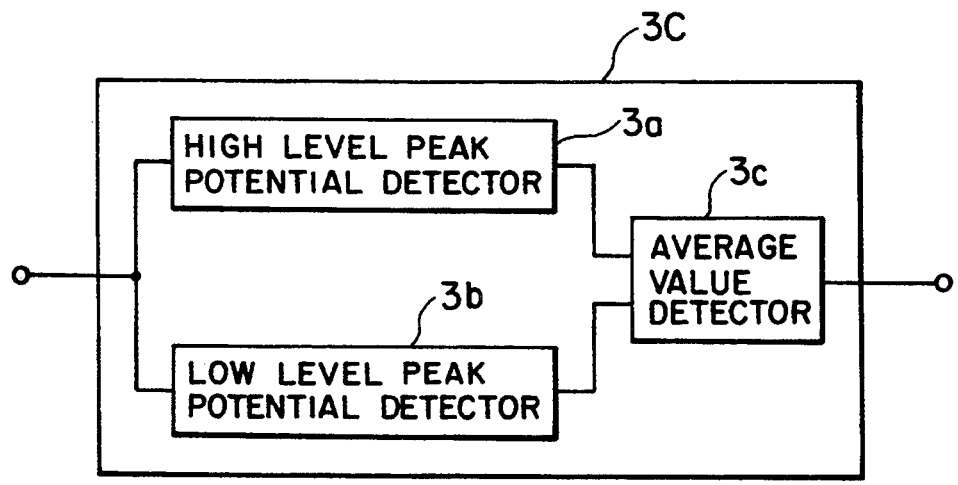
FIG. 31 is a block diagram showing a reference detector in the optical receiver.

In the standard reference potential generator 3, the low level peak potential detector 30, the high level peak potential detector 31, and the average value detector 3c are consisted as shown in FIGS. 31(b), 31(a) and 31(c), respectively.

According to the present invention, the trans impedance-type pre-amplifier 1, for example, as shown in FIG. 7, is consisted of four field effect transistors (hereinafter referred to FET) 10, 11A, 12, 13A, a feedback resistor (with a resistance value Rf) 14, a constant current source 15, and two diodes 20 and 21. The FET 11A acts as a load resistance and the FET 13A acts as a constant current source (load resistor).

Figure 30:
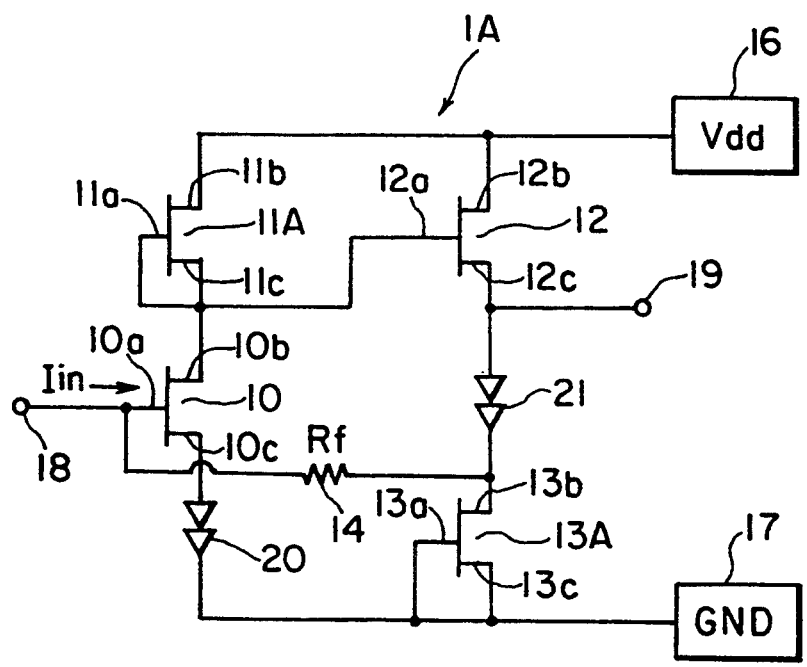
FIG. 30 is a circuit diagram showing a trans impedance-type optical receiving pre-amplifier.

The pre-amplifier 1 is formed basically in the similar manner to that in FIG. 30. The current signal Iin obtained by converting an optical signal using the light receiving element 2 is inputted to the gate terminal 10a of the input FET 10 via the input terminal 18. The input FET 10 has a drain terminal (one signal terminal) 10b connected to the first power source (GND, 0 V or positive power source Vdd) 16 via the FET 11A, a source terminal (the other signal terminal) 10c connected to the second power source (negative power source Vss or GND) 17 via the diode 20.

The output FET 12 has a gate terminal 12a connected to the drain terminal 10b of the input FET 10, a drain terminal 12b connected to the first power source 16, and a source terminal 12c connected to the second power source 17 via the diode 21 and the FET 13A. The amplified result amplified to a predetermined voltage signal is outputted to the output terminal 19 connected to the source terminal 12c.

The feedback resistor 14 feeds the output signal from the output FET 12 back to the gate terminal 10a of the input FET 10 and is arranged between the gate terminal 10a of the input FET 10 and the output terminal 19 (diode 21) of the output FET 12. The feedback resistor 14 feeds the output signal from the output FET 12 back to the gate terminal 10a of the input FET 10.

The load FET 11A has a gate terminal 11a and a source terminal 11c connected to the drain terminal 10b of the input FET 10 and to the gate terminal 12a of the output FET 12, and a drain terminal 11b connected to the first power source 16. The load FET 13A has a gate terminal 13a and a source terminal 13c connected to the second power source 17 and a drain terminal 13b connected to the feedback resistor 14 and the diode 21.

In the pre-amplifier 1 according to the present embodiment, the constant current source 15 amplifies the amplitude of the output potential of the output FET 12 to the change in an optical signal, and is arranged between the gate terminal 10a of the input FET 10 and the second power source 17.

The constant current source 15 is formed of a constant current supplying FET 150, a monitoring FET 151, and a level adjusting FET 154. The FETs used here are of a depletion (or normally-on) type.

Figure 13:
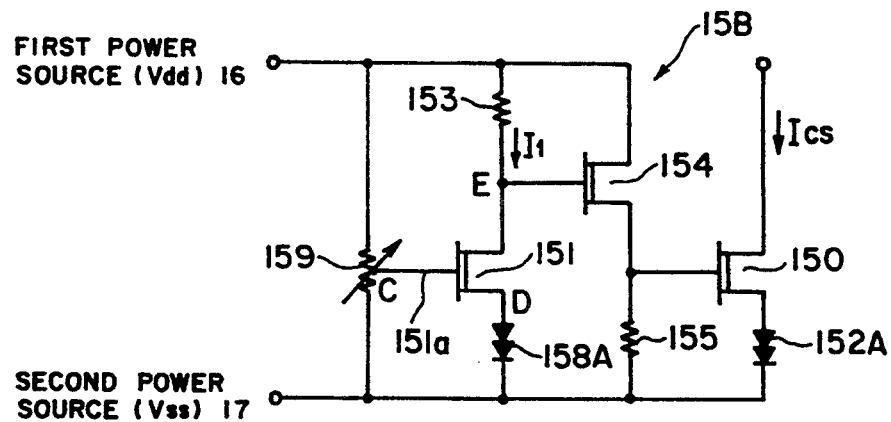
FIG. 13 is a circuit diagram showing the second modified example of the constant current source in the optical receiving pre-amplifier according to the present embodiment.

The constant current supplying FET 150 has a drain terminal (one signal terminal) 150b connected to the gate terminal 10a of the input FET 10, and a source terminal (the other signal terminal) 150c connected to the second power source via a resistance element 152. The resistance element 152 may be replaced with the diode 152A as shown in FIG. 13.

The level adjusting FET 154 has a drain terminal 154b connected to the first power source 16, and a source terminal 154c connected to the gate terminal 150a of the constant current supplying FET 150 and to the second power source 17 via the resistance element 155. The level adjusting FET 154 and the resistance element 155 are used to drop the voltage applied to the gate terminal 150a of the constant current supplying FET 150. When the power source voltage is high, the level adjusting FET 154 and the resistance element 155 can be omitted by connecting directly the gate terminal 150a of the constant current supplying FET 150 to the point A in FIG. 7. In this case, the constant current source 15 is substantially similar to that shown in FIG. 1.

Furthermore, the monitoring FET 151 has the same characteristic as that of the constant current supplying FET 150. The FET 151 also has a drain terminal (one signal terminal) 151b connected to the first power source 16 via a resistance element 153 and to the gate terminal 154a of the level adjusting FET 154, and a source terminal (other signal terminal) 151c and a gate terminal 151a connected to the second power source 17.

The optical receiver according to the present embodiment, after the pre-amplifier 1 amplifies a current signal Iin from the light receiving element 2 to a predetermined voltage signal, the limiter amplifier 4 amplifies the output signal from the pre-amplifier 1 based on the predetermined standard reference potential (center potential between the upper and lower levels of the output signal from the pre-amplifier 1A) from the standard reference potential generator 3.

In the pre-amplifier 1 according to the present embodiment, an optical signal Iin is obtained by converting by the light receiving element 2 an optical signal representing a digital signal received via an optical fiber (not shown) from the transmission side, and is supplied to the gate terminal 10a of the input FET 10 via the input terminal 18. The potential of the drain terminal 10b of the input FET 10 is supplied to the gate terminal 13a of the output FET 12 and the potential of the source terminal 12c of the output FET 12 is outputted as amplified result to the output terminal 19.

Since the constant current source 15 is arranged between the gate terminal 10a of the input terminal FET 10 and the second power source 17, the current Ics from the constant current source 15 flows through only the feedback resistor 14 but not through the input terminal 18 to increase the dc voltage of the input terminal 19 by the voltage component (Ics×Rf). The dc voltage is maximized when there is no current signal Iin from the light receiving element to the input terminal 18.

Hence when the constant current source 15 is added, even if the input current Iin becomes large due to an excessive optical signal power, the pre-amplifier 1 can provide no output waveform distorted due to saturation, widened dynamic range and sufficient eye aperture.

An error occurring in the standard reference potential generator 3 for producing a standard reference potential to the limiter amplitude 4 can be neglected by using the pre-amplifier 1 shown in FIG. 7 as the pre-amplifier in the optical receiver in FIG. 8 so that the standard reference potential generator 3 can produce accurately a predetermined standard reference potential. The reason is, for example, because the pre-amplifier 1 in a high gain state provides a large output amplitude when the transmission distance is short and the optical power inputted to the light receiving element 2 is relatively large. Moreover, the adjusting terminal in the standard reference potential generator 3 can be removed and the gain used for the standard reference potential generator 3 can be reduced. Thus the reduced circuit scale and low power consumption can be realized.

Figure 11:
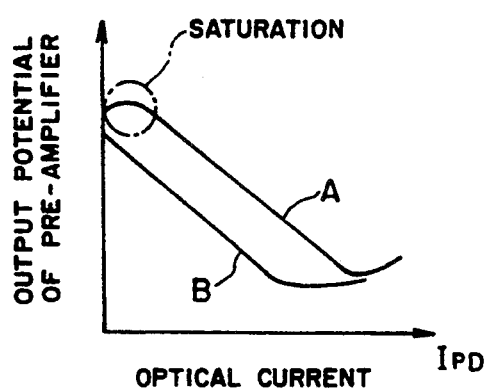
FIG. 11 is a graph explaining the function of the constant current source in the optical receiving pre-amplifier according to the present embodiment.

When the current Ics from the constant current source 15 becomes excessive, the characteristic shown in FIG. 5 saturates near to the area of Iin=0 (refer to FIG. 11). However, when the constant current source, for example, is formed of a FET having the same dimensions as FET 13A, since Ics ∝ Wg (gate width), selecting a proper gate width can prevent the characteristic saturation.

Generally, the drain current Id of a FET is held by the following expression (1):

$$Id \propto \beta^* (Vgs-Vth) \quad (1)$$

where Vth is a threshold voltage of a FET (with a negative value in the case of a depletion-type), Vgs is a gate-source voltage of a FET, and $\beta$ is a normalized gm parameter (drain conductance).

As understand from the expression (1), if the dimension of FET 13A is used for the constant current source 15, the drain current Id corresponding to the constant current Ics varies largely in response to a varied threshold voltage Vth and parameter $\beta$, whereby the characteristics of the pre-amplifier 1 is varied largely.

In the constant current source 15 of the present embodiment, the monitoring FET 151 having the same characteristic as the constant current supplying FET 150 is connected to the constant current supplying FET 150 via the level adjusting FET 154. A variation in the threshold voltage Vth is monitored with a variation in the drain current Id flowing through the FET 151. The variation $\Delta$Vth is cancelled by equalizing the increment $\Delta$Vth of the threshold voltage Vth with the decrement $\Delta$Vgs of the gate-source voltage Vgs of the constant current supplying FET 150.

The variation $\Delta$Vth of the threshold voltage Vth can be automatically compensated with the gate-source voltage Vgs of the constant current supplying FET 150 so that a constant drain current can be supplied as a desired constant current Ics without depending on the threshold Vth of the constant current supplying FET 150.

For example, when the threshold voltage Vth varies by $+\Delta$Vth, the drain current Id decreases in accordance with the expression (1). It is considered that the layout where circuit forming elements are arranged very closely to one another tends to vary all elements in the same direction. According the configuration of the present embodiment, $+\Delta$Vth variation decreases the current Ii flowing through the resistance element 153.

Hence, since the potential rise at the point A in FIG. 7 boosts the gate to source voltage Vgs of the level adjusting FET 154, the drain current I2 increases, thus increasing the gate to source voltage Vgs of the constant current supplying FET 150 by $\Delta$Vgs. In reference to the expression (1), if $\Delta$Vgs=$\Delta$Vth, the current Ics does not vary. The relation of $\Delta$Vgs=$\Delta$Vth can be established by setting properly the resistance values of the resistance elements 152, 153, and 155. The $\beta$ variation is compensated in the similar manner to that to the threshold voltage Vth.

FIGS. 10(a) to 10(e) show simulated results of variations in the current 1 with respect to threshold voltage variations $\Delta$Vth, parameter variations $\Delta\beta$, temperature, resistance variations $\Delta$R, and power source voltage variations $\alpha$Vss, in comparison with the case of the constant current source 15 of the present embodiment indicated with the symbol (0) and the case of the constant current source using the dimensions of FET13A indicated with the symbol (x).

Figure 10A:
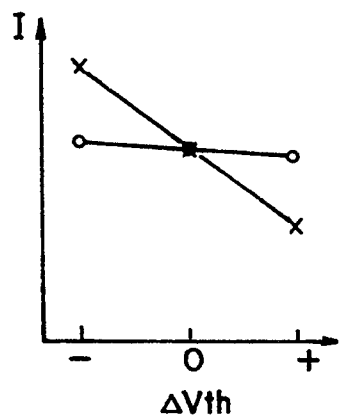
FIGS. 10(a) to 10(e) are graphs each showing the variations in output current due to various variations of a constant current source in an optical receiving pre-amplifier of the present embodiment.
Figure 10B:
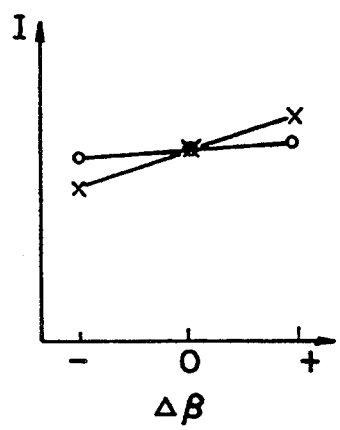

As shown in FIGS. 10(a) and 10(b), the threshold voltage variations $\Delta$Vth of the constant current source 15 and the current variations due to parameter variations $\Delta\beta$ are suppressed largely.

As for the resistance variation $\Delta$R, a small variation in resistance increases the current increases in accordance with an increased potential at the point A in FIG. 7. However, the reduced resistance increases the current and acts so as to suppress the output amplitude variation as shown in FIG. 10(d), thus resulting in good effect.

Figure 10C:
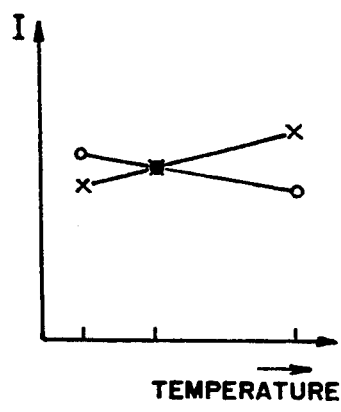
Figure 10D:
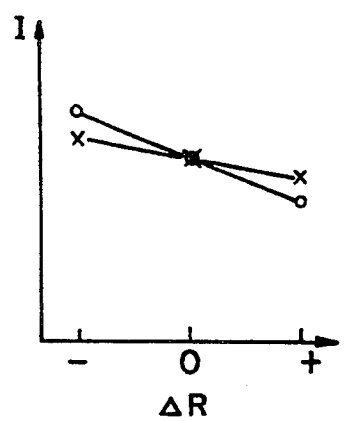

As for the temperature variation, as shown in FIG. 10(c), the current decreases with the temperature rise because the resistance variation dominates the variations in the threshold voltage Vth and parameter $\beta$. The resistance value increasing with the temperature rise acts so as to control the output amplitude variations.

Figure 10E:
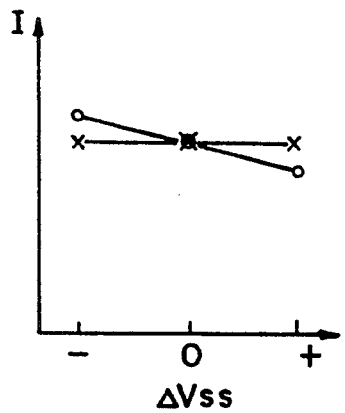

The variation in the power source voltage, as shown in FIG. 10(e), leads to an increased current variation. The reason is that when the gate width is narrower, the drain current Id in the expression (1) depends on the drain to source voltage Vds.

Figure 12:
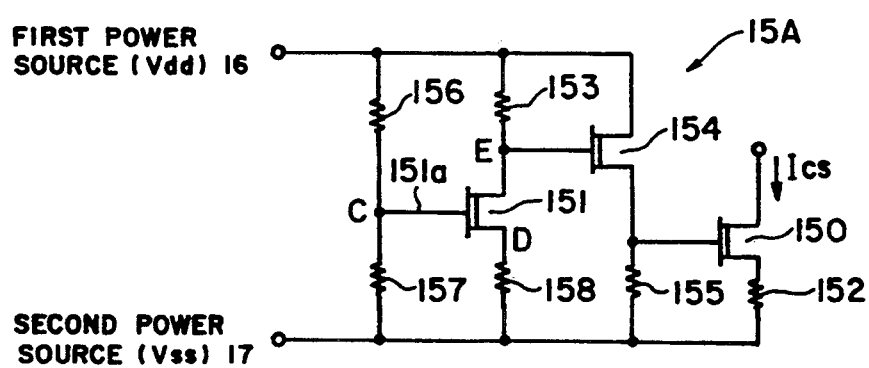
FIG. 12 is a circuit diagram showing the first modified example of the constant current source in the optical receiving pre-amplifier according to the present embodiment.

When the countermeasure against a variation in the power source voltage is required severely, it may be considered that the constant current source 15 is formed as the constant current source 15A shown in FIG. 12 or the constant current source 15B shown in FIG. 13.

In the constant current source 15A shown in FIG. 12, the gate terminal 151a of the monitoring FET 151 is connected to the first power source 16 via the resistance element 156 and the second power source 17 via the resistance element 157, and the other signal terminal 151c of the monitoring FET 151 is connected to the second power source 17 via the resistance element 158.

In the constant current source 15B shown in FIG. 13, the gate terminal 151a of the monitoring FET 151 is connected to the first power source 16 and the second power source 17 via variable resistor 159, and the other signal terminal 151c of the monitoring FET 151 is connected to the second power source 17 via the diode (resistance element) 158A. As described above, in the constant current source 15B, the resistance element 152 in the constant current source 15 is replaced for the diode 152A.

In the constant current sources 15A and 15B shown in FIGS. 12 and 13, the potential of the gate terminal 151a of the monitoring FET 151 is set properly by dividing with the two resistance elements 156 and 157 or the variable resistor 159. Thus the potential of the gate terminal 150a of the constant current supplying source FET 150 or the gate to source voltage Vgs thereof can be adjusted to suppress the variations in the drain current of the constant current supplying FET 150 with respect to the power source voltage variations.

As an example, when the power source Vss is increased, the drain to source voltage Vds of the constant current supplying FET 150 increases, thus increasing the drain current. Referring to FIGS. 12 and 13, since the potential at the points C becomes larger than that at the point D, the gate to source voltage Vgs increases, thus resulting in an increased current I2. Hence the potential at the point E falls while the gate to source voltage Vgs decreases so that an increase in the current is suppressed.

As described above, the constant current sources 15, 15A and 15B do not depend on the variations in FETs due to the manufacturing process and can produce a fixed drain current as a desired constant current Ics. Using such constant current sources 15, 15A, and 15B increase the manufacturing yield of the pre-amplifier 1 and decrease extremely the variations in circuit characteristics of the pre-amplifier 1.

Particularly, as shown with the line A in FIG. 11, an excessive current from the constant current source due to the parameter variation of the FET element causes a saturated current near to an optical current of zero, thus decreasing the gain. However, as shown with the line B in FIG. 11, the constant current sources 15, 15A, and 15B can derive the full output amplitude (full dynamic range) from the pre-amplifier 1, without a consideration of the saturation.

Figure 9:
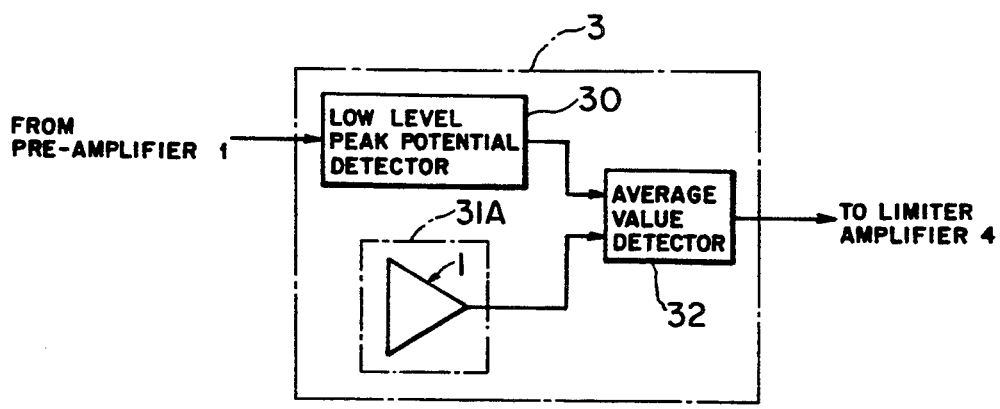
FIG. 9 is a block diagram showing a modified example of a reference potential generator according to the first embodiment of the present invention.

In the first embodiment, the standard reference potential generator 3 may be constituted as shown in FIG. 9. In the standard reference potential generator 3 shown in FIG. 9, the low level peak potential detector 30 and the average value detector 32 are similar to those in FIG. 8. The high level peak potential detector 31A is constituted as that in the pre-amplifier 1 shown in FIG. 7.

In the above configuration, when an input signal is not inputted to the gate terminal 10a of the input FET 10 of the pre-amplifier 1 forming the high level peak potential detector 31A, the output of the output FET 12 is maximized as shown in FIG. 5, thus being inputted as a high level peak potential to the average value detector 32 of the standard reference potential generator 3.

The reason that such a high level peak potential detector 31A can be used is that the pre-amplifier 1 shown in FIG. 7 produces an output signal with a large amplitude so that the error occurring in the standard reference potential generator 3 can be ignored and a higher detection accuracy is not required to detect the high level peak potential.

(c) Explanation of the Second Embodiment

Figure 14:
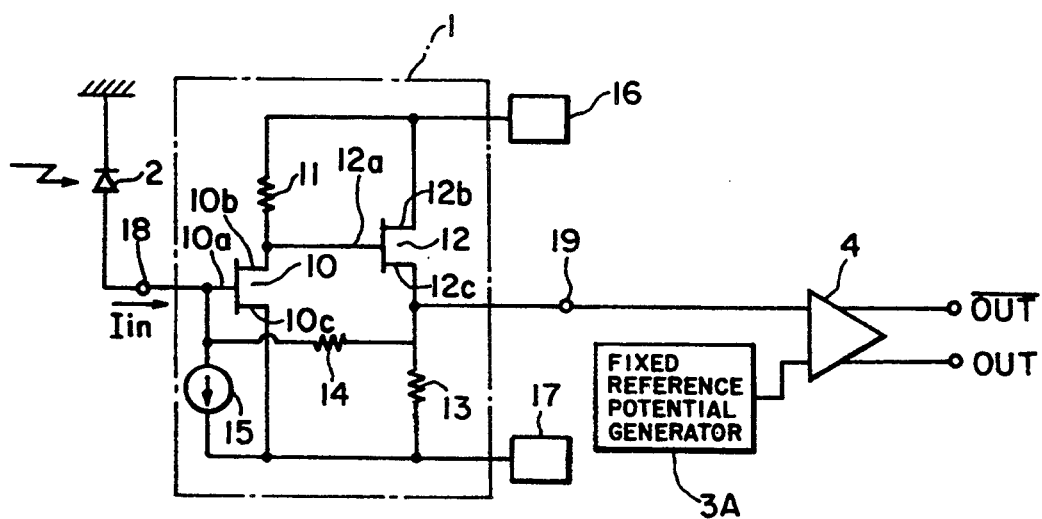
FIG. 14 is a block diagram showing an optical receiver according to the second embodiment of the present invention.

FIG. 14 is a diagram showing the optical receiver according to the second embodiment of the present invention. Since like symbols and numerals represent like elements, the overlapped explanation will be omitted below.

The second embodiment shown in FIG. 14 is applied to the case where an automatic power controller (APC) on an optical signal transmission side (not shown) transmits optical signals with a constant output. A fixed reference potential generator 3A which produces a fixed reference potential as a predetermined standard reference potential to the limiter amplifier 4 is used in place of the standard reference potential generator 3 of the first embodiment.

When the optical power from the optical transmission side is maintained at a fixed value by the APC, the variation in the optical signal power inputted to the light receiving element 2 in the optical receiver becomes relatively small. Therefore a problem in accuracy does not arise even if a fixed potential is used as a predetermined standard reference potential since a predetermined standard reference potential for the limiter amplifier 4 is not produced based on the output signal from the pre-amplifier 1 by using the standard reference potential generator 3 shown in FIGS. 8 and 9.

In the second embodiment, the fixed reference potential generator 3A which produces a fixed reference potential as the standard reference potential generator supplies the fixed reference potential as a predetermined standard reference potential to the limiter amplifier 4. Hence the circuit configuration can be simplified comparing the first embodiment.

(d) Explanation of the Third Embodiment

Figure 15:
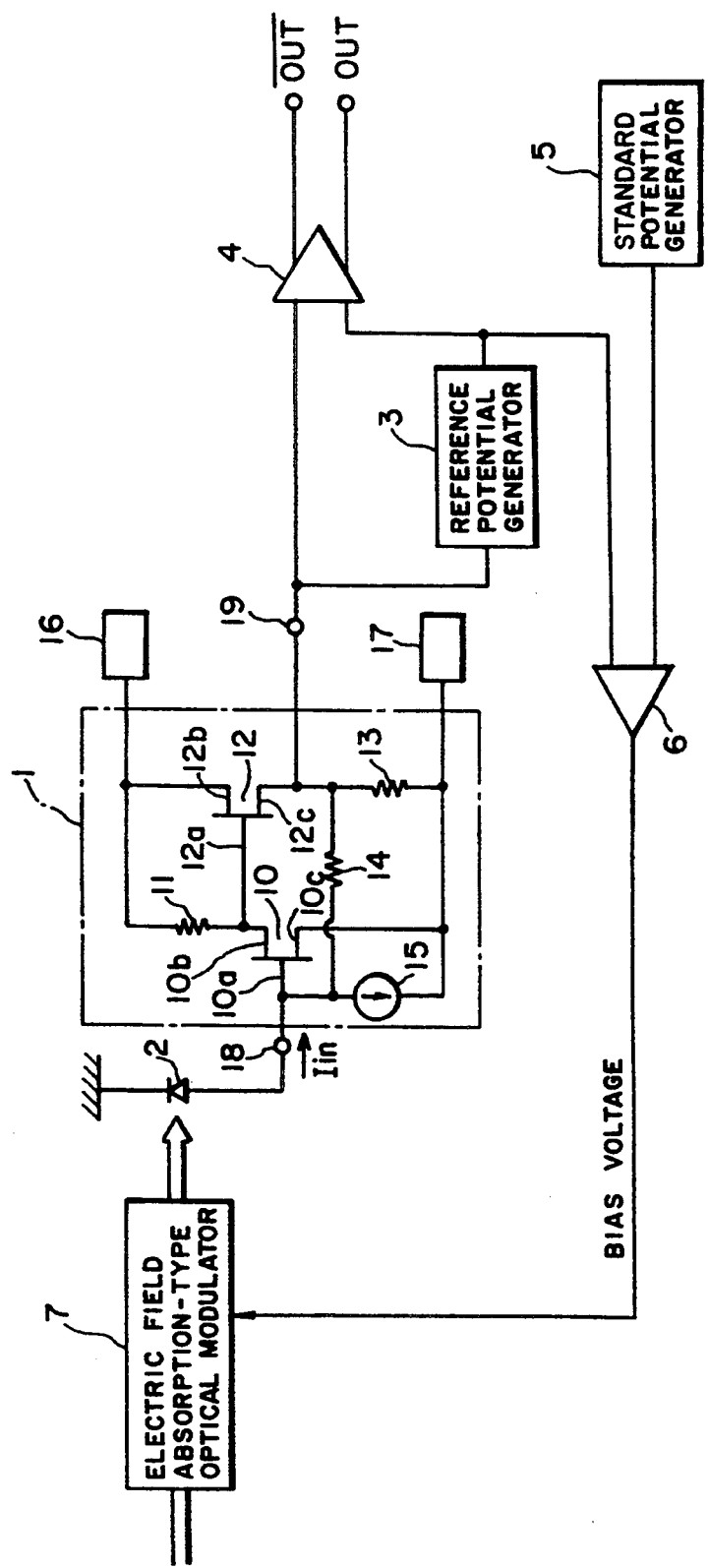
FIG. 15 is a block diagram showing an optical receiver according to the third embodiment of the present invention.

FIG. 15 is a block diagram showing the optical receiver according to the third embodiment of the present invention. In the figure, since like symbols and numerals represent like elements, the duplicate explanation will be omitted below.

The third embodiment shown in FIG. 15 has such a configuration that the standard potential generator 5, the comparison amplitude 6, the electric field absorption-type optical modulator 7 are arranged in the first embodiment.

The electric field absorption-type optical modulator 7 attenuates a received optical signal in accordance with a bias voltage to input it to the light receiving element 2. The optical modulator 7 also has the characteristic shown in FIG. 6 and functions so as to vary the attenuation amount of a received optical signal based on the bias voltage applied.

The comparison amplifier 6 compares an output signal from the average value detector (32 in FIG. 8) in the standard reference potential generator 3 with a predetermined standard potential, outputs the deviation amplified as a bias voltage of an electric field absorption-type optical modulator 7, and controls the attenuation amount of the optical signal by the electric field absorption-type optical modulator 7.

The standard potential generator 5 produces a predetermined reference potential to output to the comparator amplifier 6.

In the above structure according to the third embodiment, an optical signal from the electric field absorption-type optical modulator 7 is converted into an electric signal in the light receiving element 2, amplified by the pre-amplifier 1, and inputted to the limiter amplifier 4. At the same time, the standard reference potential generator 3 detects the center potential of the amplitude of an output signal from the pre-amplifier 1 to supply the result as a predetermined standard reference potential to the limiter amplifier 4.

The standard reference potential from the standard reference potential generator 3 is compared with the standard potential from the standard potential generator 5 in the comparison amplifier 6 and the resultant output controls the attenuation of an optical signal in the electric field absorption-type optical modulator 7. Hence the electric field absorption-type optical modulator 7 is controlled so as to provide its large attenuation amount to a large optical power and its small attenuation amount to a small optical power. As a result, the standard reference potential generator 3 maintains the standard reference potential at a nearly fixed value (to a standard potential from the standard potential generator 5).

(e) Explanation of the Fourth Embodiment

Figure 16:
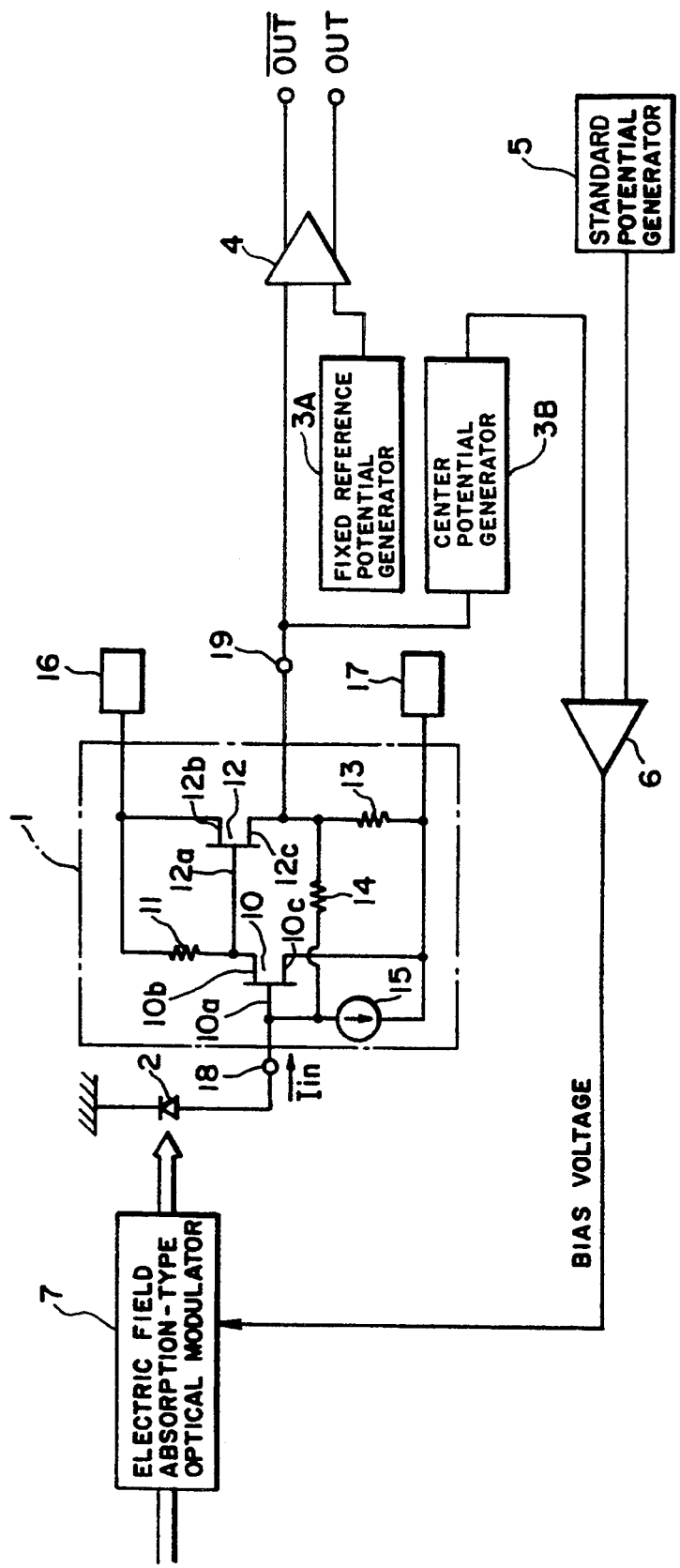
FIG. 16 is a block diagram showing an optical receiver according to the fourth embodiment of the present invention.

FIG. 16 is a block diagram showing the optical receiver according to the fourth embodiment of the present invention. In the figure, since like symbols and numerals represent like elements, the duplicate explanation will be omitted below.

The optical receiver shown in FIG. 16 includes the standard potential generator 5, the comparison amplifier 6, and the electric field absorption-type optical modulator 7, in the similar manner to that in the third embodiment.

In the fourth embodiment, the reference potential generator 3A for producing a fixed reference potential as a predetermined standard reference potential to output to the limiter amplifier 4, in place of the standard reference potential generator 3 in the third embodiment.

A center potential generator 3B (with the similar circuit configuration to the standard reference potential generators 3 shown in FIGS. 8 and 9) is arranged to produce the center potential of the amplitude of the output signal from the pre-amplifier 1. The comparison amplifier 6 compares the output signal from the center potential generator 3B with the predetermined standard potential from the standard potential generator 5. In order to control the attenuation amount of an optical signal, the resultant deviation amplified as a bias voltage for the electric field absorption-type optical generator 7 is outputted to the electric field absorption-type optical modulator 7.

In the above configuration, the center potential of the output signal amplitude is produced by the center potential generator 3B based on the output signal pre-amplifier 1. In order to maintain the output potential to the predetermined standard potential from the standard potential generator 5 the electric field absorption-type optical modulator 7 controls the attenuation amount of an optical signal based on the output signal from the comparison amplifier 6.

Since the power variation in an optical signal received by the light receiving element 2 can be relatively reduced through the above control, a fixed reference potential can be used as a predetermined standard reference potential without adjusting from time to time a predetermined standard reference potential for the limiter amplifier 4 based on the output signal of the pre-amplifier 1, in the similar manner to that of the second embodiment.

Hence, in the fourth embodiment, the fixed reference potential generator 3A produces a fixed reference potential as a predetermined standard reference potential to the limiter amplifier 4.

Figure 17:
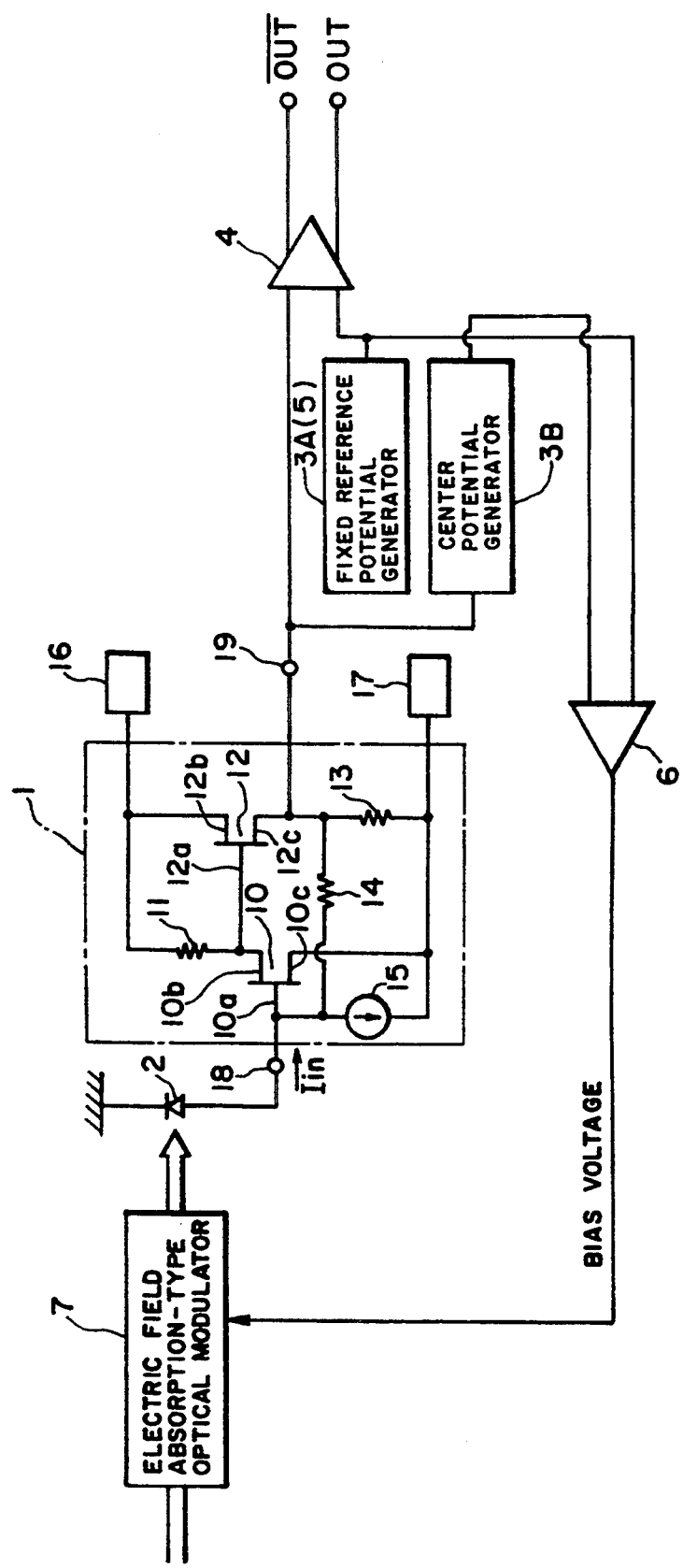
FIG. 17 is a block diagram showing a modified example according to the fourth embodiment of the present invention.

As shown in FIG. 17, the fixed reference potential generator 3A can be used as a standard potential generator 5, whereby the circuit configuration is simplified further.

(f) Explanation of the Fifth Embodiment

Figure 18:
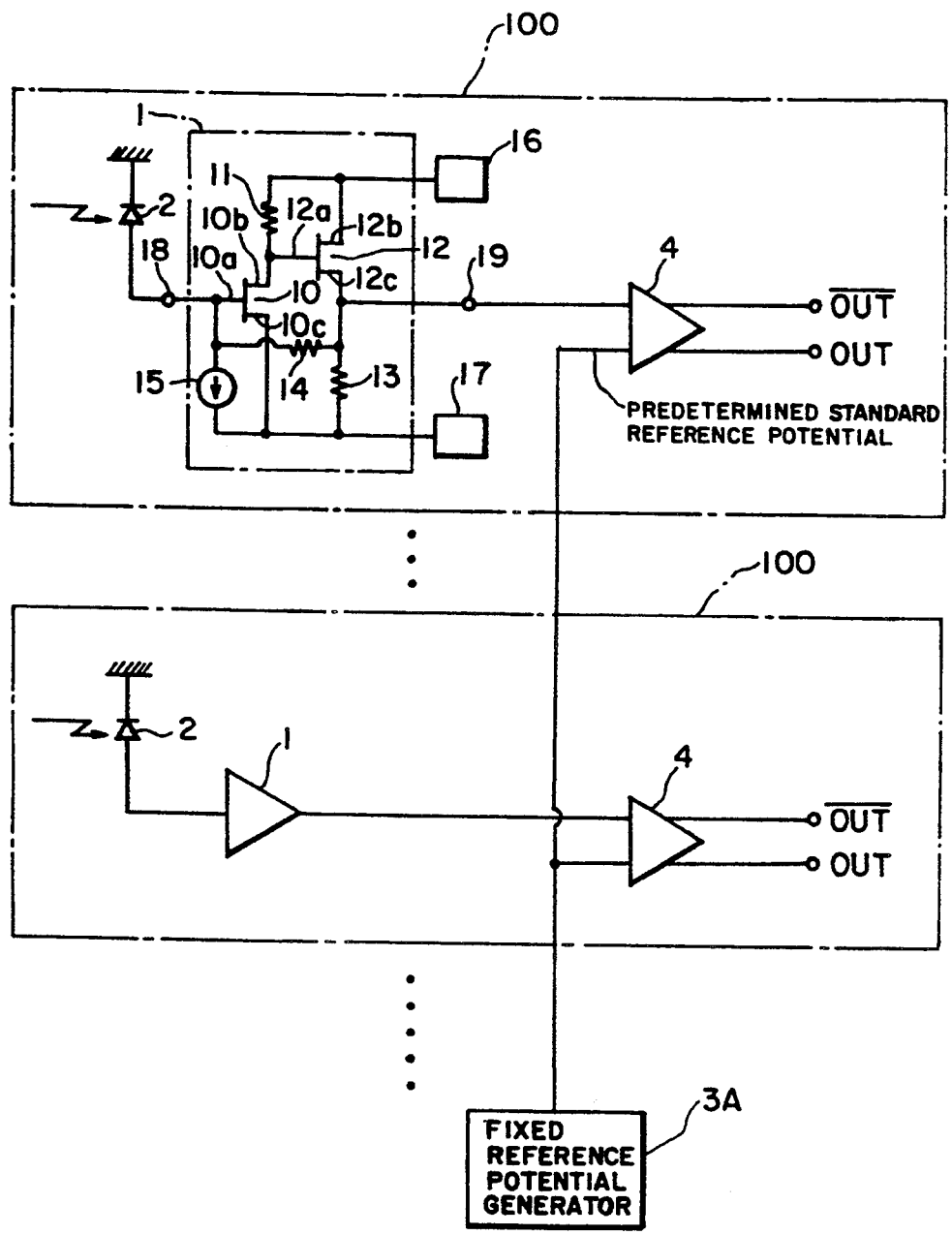
FIG. 18 is a block diagram showing an optical receiver according to the fifth embodiment of the present invention.

FIG. 18 is a block diagram showing the optical receiver according to the fifth embodiment of the present invention. In the figure, since like symbols and numerals represent like elements, the overlapped explanation will be omitted below.

In the optical receivers of the fifth to eighth embodiments (in FIGS. 18 to 21), an explanation will be made as for a plurality of optical receiving processors 100 arranged in parallel to receive respectively optical signals from plural channels, each of the processors which includes the light receiving element 2, the pre-amplifier 1 and the limiter amplifier 4.

In the optical receiver shown in FIG. 18, like that in FIG. 7, the pre-amplifier 1 in each of the optical receiving processors 100 has a constant current source 15 arranged between the gate terminal 10a of the input FET 10 and the second source 17. The constant current sources 15A and 15B shown in FIGS. 7, 12, and 13 may be used as the constant current source 15.

When the constant current source 15 (15A and 15B) is arranged to the pre-amplifier 1 in each optical receiving processor 100, the fixed reference potential generator can be arranged in common to the plural optical receiving processors 100 to produce a fixed reference potential as a predetermined standard reference potential to the limiter amplifier 4 in each optical receiving processor 100.

The above structure includes plural optical receiving processors 100 arranged in parallel each of which the light receiving element 2, the pre-amplifier 1, and the limiter amplifier 4 and can receive in parallel optical signals from plural channels.

Since the pre-amplifier 1 in each optical receiving processor 100 is formed in the similar manner to that shown in FIG. 7, even if the optical power is excessive, the output waveform of the pre-amplifier 1 does not distorted due to the saturation. Hence as shown in FIG. 5, the dynamic range of the pre-amplifier 1 in each optical receiving processor 100 is widened largely, comparing with the conventional one.

In this case, the constant current sources 15A and 15B shown in FIGS. 7, 12, and 13 is used as the constant current source 15 in the pre-amplifier 1, a constant drain current can be obtained as a desired constant current in each optical receiving processor 100, without depending on the threshold voltage Vth of the constant current supplying FET (150 in FIGS. 7, 12, and 13). Thus the variation of the circuit characteristics or output potential of the pre-amplifier 1 in each optical receiving processor 100 can be decreased extremely.

As described above, the fixed reference potential generator 3A can be shared to the plural optical receiving processors 100 to use comprehensively the fixed reference potential as a predetermined standard reference potential for the limiter amplifier 4 in each optical receiving processor 100, thus leading to a simplified circuit structure. An externally adjustable circuit may be used as the fixed reference potential generator 3A.

(g) Explanation of the Sixth Embodiment

Figure 19:
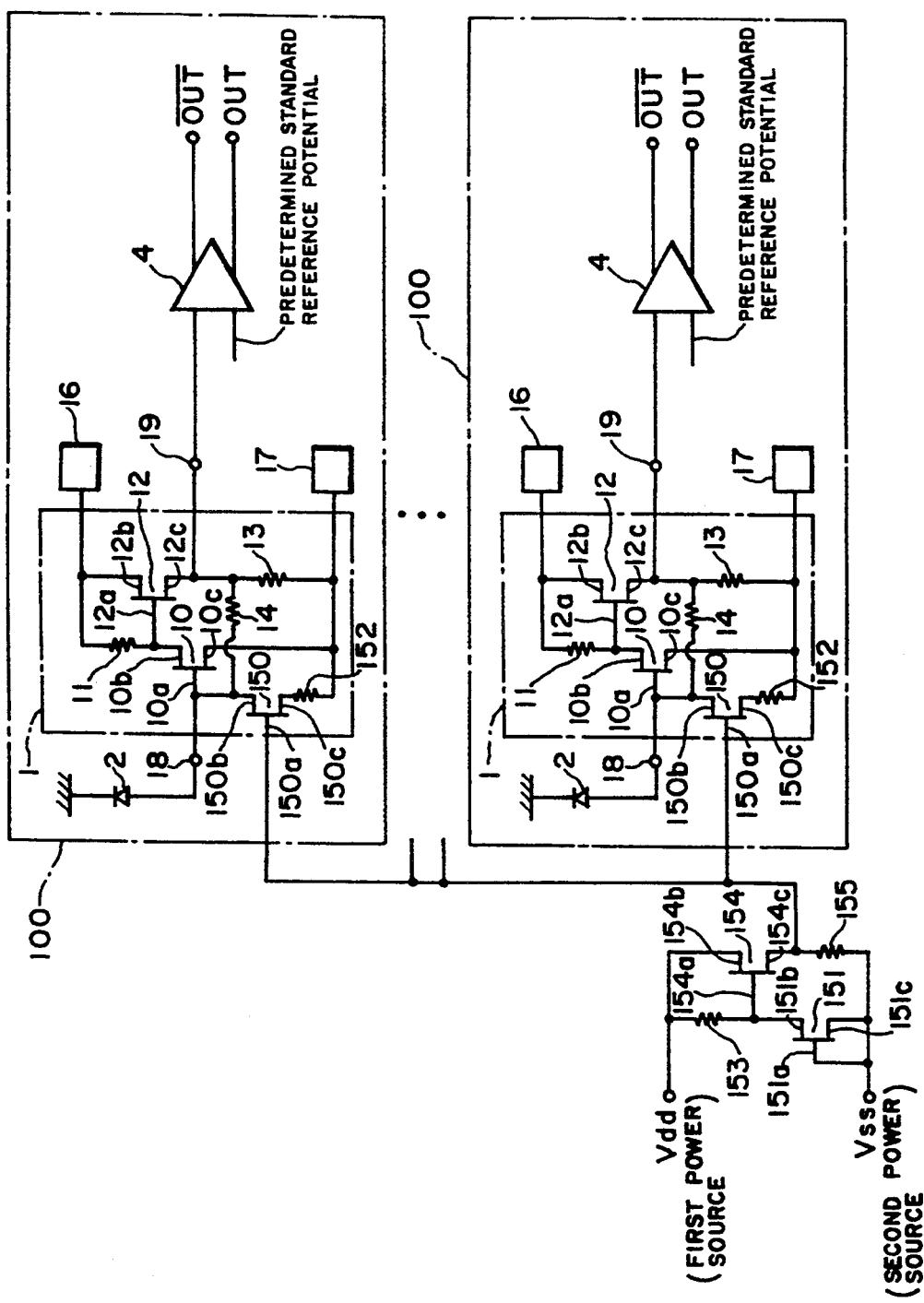
FIG. 19 is a block diagram showing optical receiver according to the sixth embodiment of the present invention.

FIG. 19 is a block diagram showing the optical receiver according to sixth embodiment of the present invention. In the figure, since like symbols and numerals represent like elements, the duplicate explanation will be omitted below.

In the sixth embodiment shown in FIG. 19, a constant current supplying FET 150 is arranged to the pre-amplifier 1 in each optical receiving processor 100, and a monitoring FET 151 as well as a level adjusting FET 154 each which have the similar characteristic to that of the FET 150 are used in common to the constant current supplying FETs 150 of the pre-amplifiers 1 in the plural optical receiving processors.

In the similar manner to that in FIG. 7, each constant current supplying FET 150 has a drain terminal (one signal terminal) 150b connected to the gate terminal 10a of the input FET 10, a source terminal (the other input terminal) 150c connected to the second power source 17 via the resistance element 152, and a gate terminal 150a connected to the source terminal 154c of a common level adjusting FET 154.

The level adjusting FET 154, in the similar manner to that in FIG. 7, has a drain terminal 154b connected to the first power source 16, and a source terminal 154c connected to the gate terminal 150a of the constant current supplying FET 150 and to the second power source 17 via the resistance element 155.

Furthermore, the monitoring FET 151, in the similar manner to that in FIG. 7, has a drain terminal 151b connected to the first power source 16 via the resistance element 153 and to the gate terminal 154a of the level adjusting FET 154, and a source terminal 151c and a gate terminal 151a connected to the second power source 17.

The drain terminal 151b of the monitoring FET 151 may be connected directly to the gate terminal 150a of the constant current supplying FET 150, whereby the level adjusting FET 154 and the resistance element 155 is removed. The gate terminal 151a of the monitoring FET 151, as shown in FIGS. 12 and 13, may be connected to the power sources 16 and 17 to the resistance elements 156 and 157 and the variable resistor 159.

In each optical receiving processor 100 of the sixth embodiment, in the similar manner to that in the fifth embodiment, a constant drain current can be supplied as a desired constant current without depending on the threshold voltage Vth of the constant current supplying FET 150 so that the variation in the output potential of the pre-amplifier 100 in each optical receiving processor 100 can be reduced largely. A fixed reference potential generator 3A (refer to FIG. 18) can be used in common each optical receiving processor 100 to produce a predetermined standard reference potential to a limiter amplifier 4. The circuit structure can be simplified because the monitoring FET 151 as well as the level adjusting FET 154 are used in common to the plural optical receiving processors 100.

In the optical receiving processor 100 where a common signal (a data signal of no ½ mark ratio) is inputted, the standard reference potential generator 3, as shown in FIGS. 8 and 9, produces a predetermined standard reference potential to the limiter amplifier 4. In the optical receiving processor 100 where a clock signal or a data signal with about ½ mark ratio coded by a scrambler is inputted as an input signal, the average value detector 33 (described later with FIG. 22) produces a predetermined standard reference potential for the limiter amplifier 4.

(h) Explanation of the Seventh Embodiment

Figure 20:
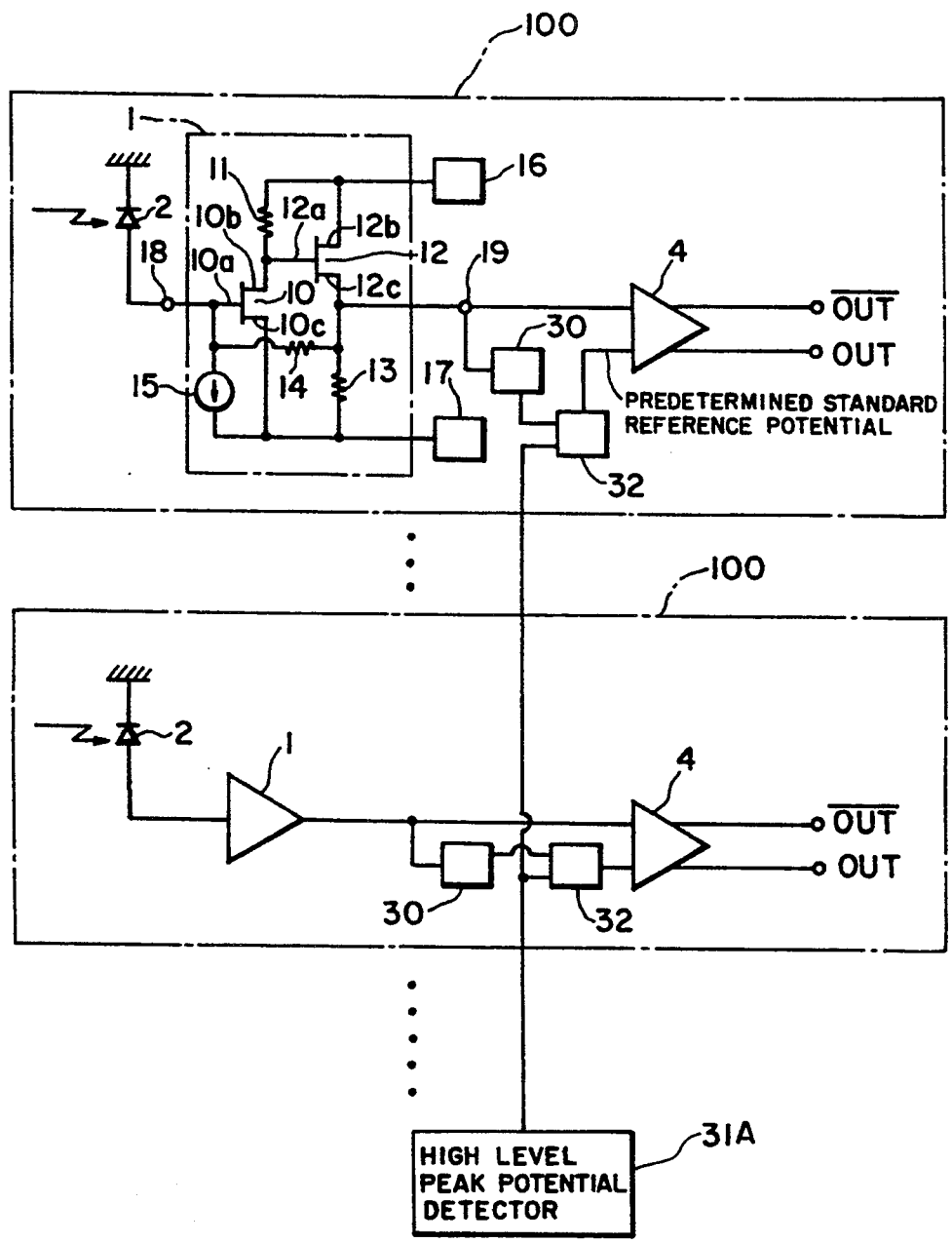
FIG. 20 is a diagram explaining an optical receiver according to the seventh embodiment of the present invention.

FIG. 20 is a block diagram showing the optical receiver according to the seventh embodiment of the present invention. In the figure, since like symbols and numerals represent like elements, the duplicate explanation will be omitted below.

In the optical receiver shown in FIG. 20, each optical receiving processor 100 includes a low level peak potential detector 30 and an average value detector 32. The high level peak potential detector 31A is used common to the plural optical receiving processors 100.

Like the first embodiment shown in FIG. 9, the high level peak potential detector 31A has the similar circuit configuration to the pre-amplifier 1 shown in FIG. 7. When no input signal is inputted to the gate terminal 10a of the input FET 10, the detector 31A detects the output signal of the output FET 12 as a high level peak potential of the output signal for the pre-amplifier 1 to output to the average value detector 32 in each optical signal processor 100.

The average value detector 32 detects the average value (or the center potential of the amplitude of an output signal from the pre-amplifier 1) of the output from the low level peak potential detector 30 and the output from the common high level peak potential detector 31A and outputs the resultant potential as a predetermined standard reference potential to the limiter amplifier 4.

In the seventh embodiment, like the fifth embodiment, since the pre-amplifier 1 for each channel has a large output variation, even if plural circuits for multi-channels are formed in parallel on the same IC chip, the relative variation between the circuits can be neglected. Therefore the high level peak potential detector 31A for providing a standard reference potential can produce in common the potential for the each channel. This feature can simplify the circuit configuration and lower power consumption.

(i) Explanation of the Eighth Embodiment

Figure 21:
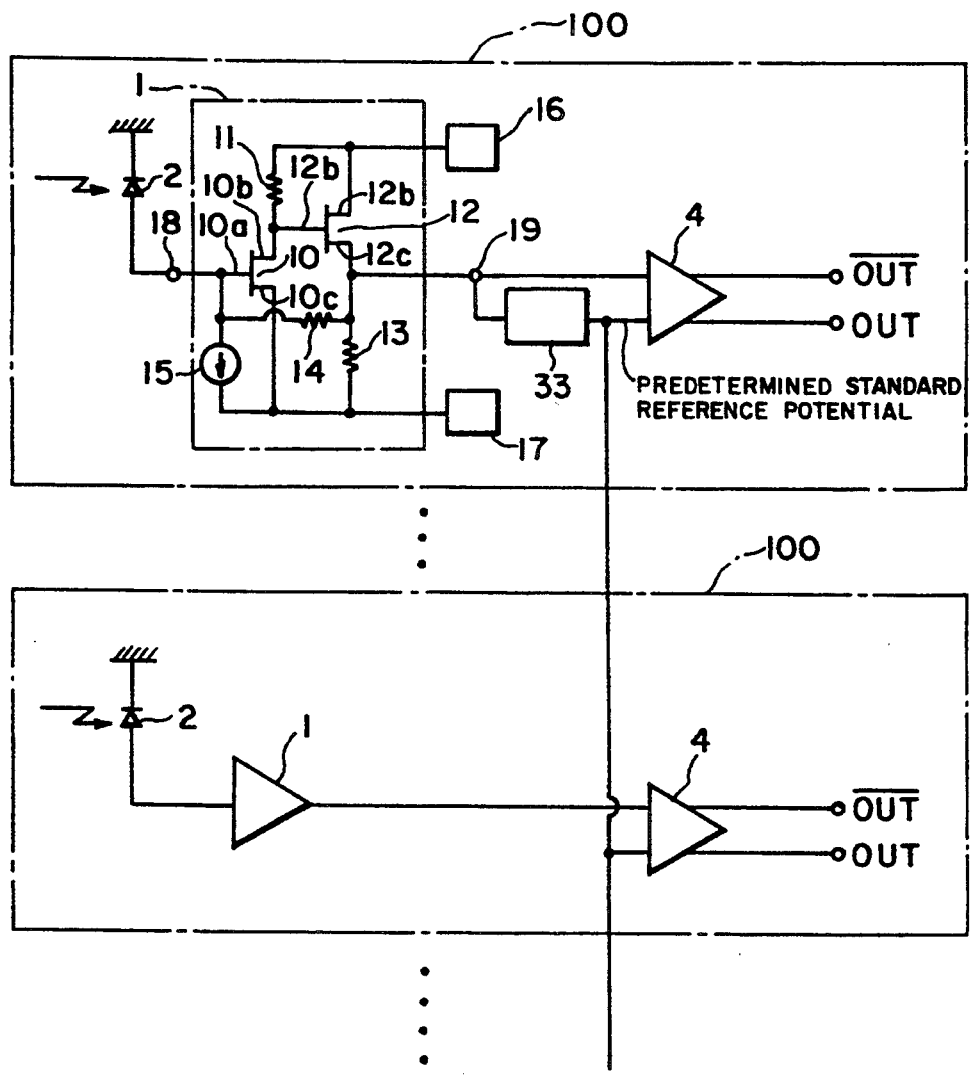
FIG. 21 is a block diagram showing an optical receiver according to the eighth embodiment of the present invention.

FIG. 21 is a block diagram showing the optical receiver according to the eighth embodiment of the present invention. In the figure, since like symbols and numerals represent like elements, the duplicate explanation will be omitted below.

In the plural optical receiving processors 100 shown in FIG. 21, an optical receiving processor 100 (for example, the upmost optical receiving processor in FIG. 21) which receives a data signal of ½ mark ratio includes an average value detector 33 for detecting an average value of an output signal from the pre-amplifier 1. The output signal from the average value detector 33 is used in common as a predetermined standard reference potential for the limiter amplifiers 4 in the plural optical receiving processors 100.

The standard reference potential for the limiter amplifier 4 for each channel is obtained from the average value detector 33 which receives the output from the pre-amplifier 1 which inputs a data signal (data obtained by scrambling data by a scrambleror, or clock signals) with ½ mark ratio.

Figure 22:
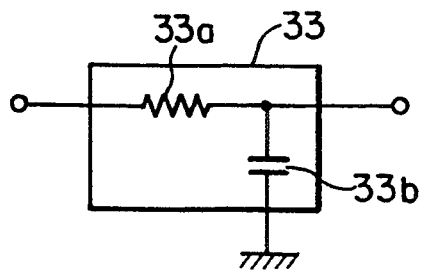
FIG. 22 is a circuit diagram showing an average value detector according to the eighth embodiment of the present invention.

The average value detector 33, for example, shown in FIG. 22, is a low pass filter formed of a resistance element 33a and a capacitor 33b. When the average value detector 33 receives a data signal with ½ mark ratio, it detects the average value and outputs the standard reference potential. Hence the detector 33 functions substantially as the standard reference potential generator 3 to the input signal.

In the optical receiver according to the eighth embodiment, when the ½ mark ratio data signal inputting optical receiving processor 100 is arranged, the average value detector 33 is arranged to detect the average value of the output signal from the pre-amplifier 1. Thus the circuit configuration of each of the optical receiving processors 100 can be simplified further by using in common the output from the average value detector 33 as a predetermined standard reference potential for limiter amplifiers 4 in the plural optical receiving processors 100.

Usually, since an optical receiving processor 100 for performing a clock signal receiving process is arranged for at least one of channels receiving a clock signal, the clock signal can be used to produce a predetermined standard reference potential using the average value detector 33. When optical signals for plural channels are subjected to a parallel receiving process, it is not necessary to add another ½ mark ratio data signal inputting optical receiving processor 100 to produce a predetermined standard reference potential. Hence the device configuration according to the present embodiment can be realized easily.

Figure 32A:
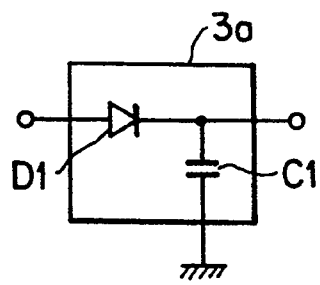
FIGS. 32(a) to 32(c) are circuit diagrams showing various circuit configuration of the reference detector shown in FIG. 31.
Figure 32B:
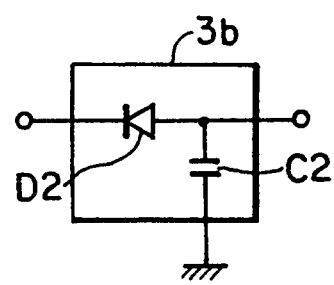
Figure 32C:
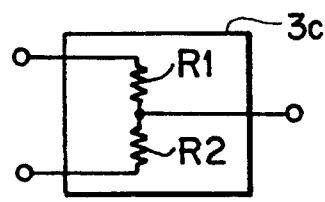
Figure 33:
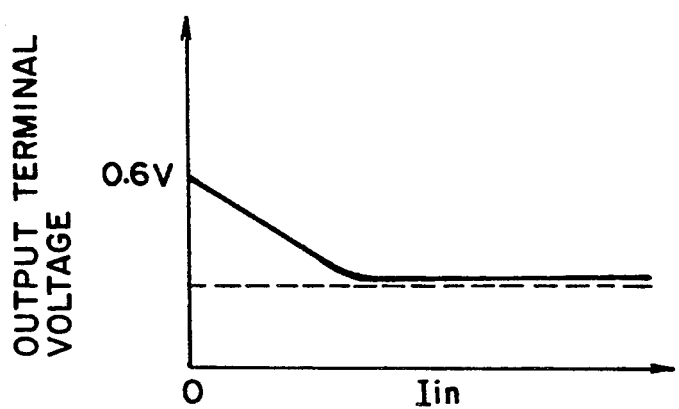
FIG. 33 is a graph showing the input/output characteristic of a trans impedance-type optical receiving pre-amplifier.

Furthermore, using a low-pass filter-type average value detector 33 does not require any diodes forming the low level peak potential detector and the high level peak potential detector (see FIGS. 31 and 32), whereby the standard reference potential error can be suppressed to a low level.

(j) Explanation of the Ninth Embodiment

Figure 23:
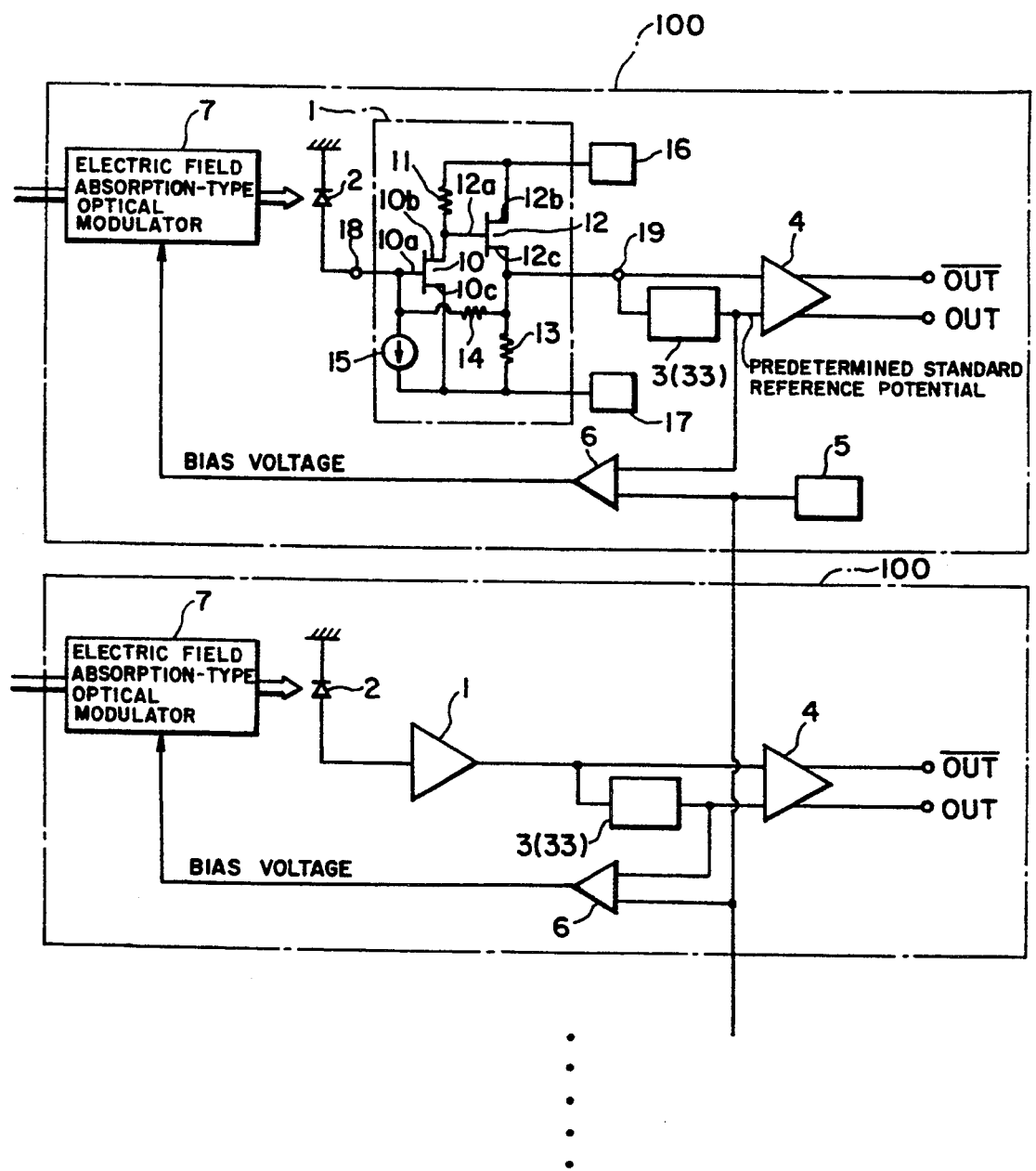
FIG. 23 is a block diagram showing an optical receiver according to the ninth embodiment of the present invention.

FIG. 23 is a block diagram showing the optical receiver according to the ninth embodiment of the present invention. In the figure, since like symbols and numerals represent like elements, the overlapped explanation will be omitted below.

In the devices according to the ninth to eleventh embodiments, an explanation is made as for plural optical receiving processors 100 arranged in parallel which receive optical signals corresponding to plural channels. Each of the optical receiving processors 100 is formed of a light receiving element 2, a pre-amplifier 1, a limiter amplifier 4, and an electric field absorption-type optical modulator 7.

In the ninth embodiment shown in FIG. 23, each of the optical receiving processors 100 includes a standard reference potential generator 3 (or the average value detector 33 shown in FIG. 22) for producing the center potential of the output signal amplitude of the pre-amplifier 1 as a predetermined standard reference potential to output to the limiter amplifier 4, in addition of the light receiving element 2, the pre-amplifier 1, the limiter amplifier 4, the comparison amplifier 6, and the electric field absorption-type optical modulator 7.

The standard potential generator 5 is arrange in common to plural optical receiving processors 100 to produce a predetermined standard potential to the comparison amplifier 6 in each of the plural optical receiving processors 100. The comparison amplifier 6 compares the output signal from the standard reference potential generator 3 (or the average value detector 33) with the output from the predetermined standard potential from the standard potential generator 5, outputs the deviation amplified as a bias voltage for the electric field absorption-type optical modulator 7, and controls the attenuation amount of an optical signal by the electric field absorption-type optical modulator 7.

In the optical receiver 100 which receives a normal signal (a data signal with no ½ mark ratio), the standard reference potential generator 3 shown in FIGS. 8 and 9 produces a predetermined standard reference potential for the limiter amplifier 4. In the optical receiving processor which receives as an input signal a clock signal or a data signal with ½ mark ratio coded by a scrambler, the average value potential generator 33 shown in FIG. 22 produces a predetermined standard reference potential for the limiter amplifier 4, in place of the standard reference potential generator 3.

In each of the plural optical receiving processors 100 according to the ninth embodiment, the light receiving element 2 converts the optical signal from the electric field absorption-type optical modulator 7 into an electric signal, and the pre-amplifier 1 amplifies it to output to the limiter amplifier 4. At the same time, the standard reference potential generator 3 (or the average value detector 33) detects the center potential of the output signal amplitude from the pre-amplifier 1 and supplies it as a predetermined standard reference potential to the limiter amplifier 4.

The standard potential from the common standard potential generator 5 is shared to each channel. The electric field absorption-type optical modulator 7 controls the attenuation amount of an optical signal in accordance with the output (bias voltage) from the comparison amplifier 6 so as to equalize the standard reference potentials obtained by the standard reference potential generators (or the average value detectors 33) 3 in all the optical receiving processors 100.

(k) Explanation of the Tenth Embodiment

Figure 24:
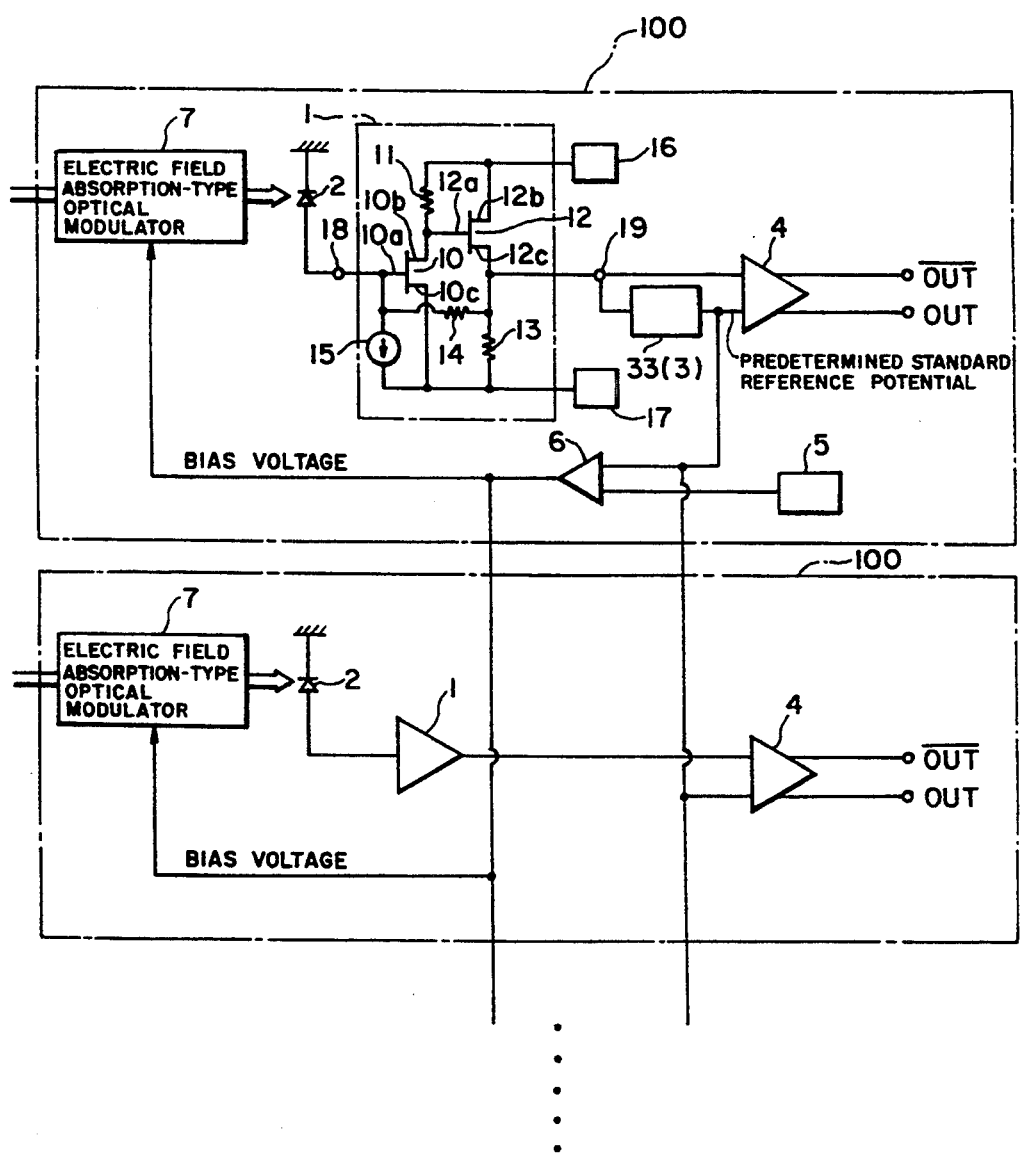
FIG. 24 is a block diagram showing an optical receiver according to the tenth embodiment of the present invention.

FIG. 24 is a block diagram showing the optical receiver according to the tenth embodiments of the present invention. In the figure, since like symbols and numerals represent like elements, the duplicate explanation will be omitted below.

In the tenth embodiment shown in FIG. 24, the optical receiving processor 100 includes the light receiving element 2, the pre-amplifier 1, the limiter amplifier 4, and the electric field absorption-type optical modulator 7.

Only an optical receiving processor 100 (for example, the upmost optical receiving processor in FIG. 24), where a data signal with ½ mark ratio is inputted, includes an average value detector 33 for detecting an average value of the output signal from the pre-amplifier 1, and a reference potential generator 5 for comparing the output signal from the average value detector 33 (see FIG. 22) with the predetermined standard potential, outputting the deviation amplified as a bias voltage of the electric field absorption-type optical modulator 7, and producing a predetermined standard potential to the comparison amplifier 6 for controlling the attenuation amount of an optical signal by the electric field absorption-type optical modulator 7.

The output signal from the comparison amplifier 6 is used in common as a bias voltage for the electric field absorption-type optical modulators 7 in plural optical receiving processors 100, and the output signal from the average value detector 33 is used in common as a predetermined standard reference potential for the limiter amplifiers 4 in the plural optical receiving processors 100.

In the ½ mark ratio data signal inputting optical receiving processor 100, the average value detector 33 detects the average value of the output signal from the pre-amplifier 1, the comparison amplifier 6 compares the output signal from the average value detector 33 with the predetermined standard potential from the standard potential generator 5, and producing the deviation amplified as a bias voltage for the electric field absorption-type optical modulator 7 to control the attenuation amount of the optical signal by the electric field absorption-type optical modulator 7.

In the optical receiving processors 100, except the ½ mark ratio data signal inputting optical receiving processors 100, the output signal (bias voltage) of the comparison amplifier 6 controls the optical signal attenuation amounts of the electric field absorption-type optical modulators 7. In this structure, when the variations in characteristics between channels in a parallel transmission system is small, the channels can receive respectively an optical signal of the same power so that a sufficient eye aperture can be obtained for all the channels by feeding a standard reference potential back to only one channel. This feature can realize the capacitor IC in the standard reference potential generator 3 externally mounted to an IC device, the small-sized circuit scale, and the low power consumption.

The circuit structure of each optical receiving processor 100 can be simplified further by sharing the output signal from the average value detector 33 as the predetermined standard reference potential for the limiter amplifier 4 in each optical receiving processor 100. Using clock signals as a ½ mark ratio data signal omits an additional optical receiving processor 100 to input the ½ mark ratio data signal.

In the tenth embodiment, a transmission system can be used where an optical receiving processor 100 with the average value detector 33 for a channel transmits a clock signal and the other optical receiving processors 100 for other channels transmit data signals in parallel. In this case, the average value detector 33 can detect accurately the center potential by the ½ mark ratio clock signal from the optical receiving processor for a clock signal transmission channel. The standard reference potential generator 3 shown in FIGS. 8 and 9 can be substituted for the average value detector 33 to detect the center potential accurately.

The optical receiving processor 100 in a channel where the average value detector 33 is arranged can transmit a data signal without transmitting the clock signal. At a data transmission time, if a data signal which is a nearly ½ mark ratio signal coded by a transmission line coding device such as a scrambler is transmitted from the transmission side, the average value detector 33 (or the standard reference potential generator 3) can receive the data signal via the pre-amplifier 1 to obtain accurately the average potential.

(l) Explanation of the Eleventh Embodiment

Figure 25:
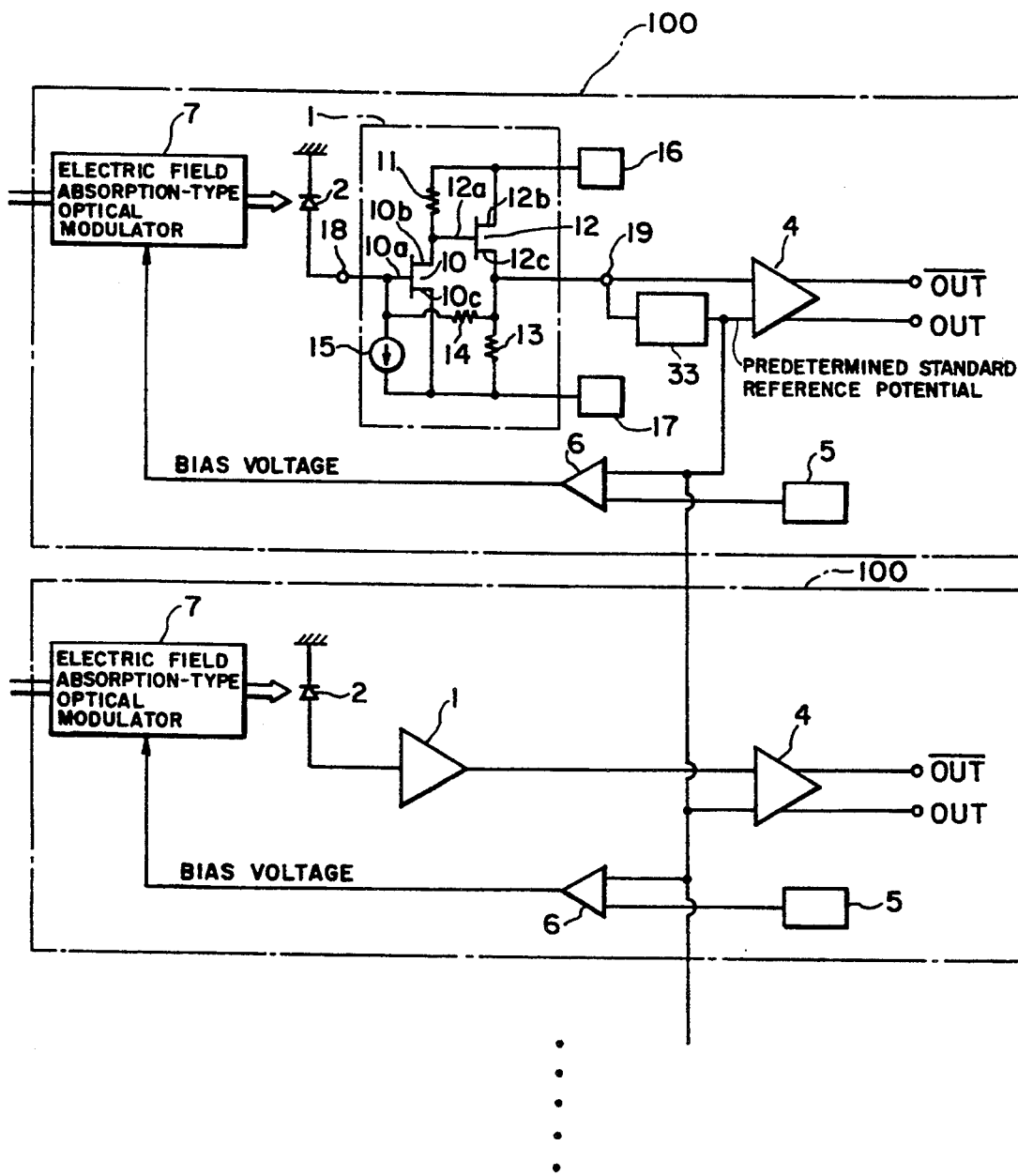
FIG. 25 is a block diagram showing an optical receiver according to the eleventh embodiment of the present invention.

FIG. 25 is a block diagram showing the optical receiver according to the eleventh embodiment of the present invention. In the figure, since like symbols and numerals represent like elements, the overlapped explanation will be omitted below.

Each of the optical receiving processors 100 shown in FIG. 25 includes a light receiving element 2, a pre-amplifier 1, a limiter amplifier 4, an electric field absorption-type optical modulator 7, a comparison amplifier 6, and a standard potential generator 5. The optical receiving processor 100 (for example, the upmost optical receiving processor in FIG. 25), where a ½ mark ratio data signal is inputted, includes the average value detector 33 for detecting the average value of the output signal from the pre-amplifier 1.

The output signal from the average value detector 33 is compared with a predetermined standard potential from the standard potential generator 5 by comparing the amplifier 6 in each optical receiving processor 100 and is used in common as a predetermined standard potential for the limiter amplifiers 4 in the plural optical receiving processors 100.

In the above structure, when an optical receiving processor 100 where a data signal with ½ data ratio is arranged, the common average value detector 33 detects the average value of the output signal from the pre-amplifier 1. The comparison amplifier 6 in each optical receiving processor 100 receives the output signal from the detector 33 and the predetermined standard potential from each standard potential generator 5 for each channel to output a different bias potential to an electric field absorption-type processor 7. The electric field absorption-type optical modulator 7 for each channel can control the attenuation amount of an optical signal.

Hence there is a variation in optical signal power in each channel in the parallel transmission, the attenuation amount of the optical signal can be adjusted by varying the standard potential voltage in accordance with each signal.

Since the output signal from the average value detector 33 is used in common as a predetermined standard reference potential for the limiter amplifier 4 in each optical receiving processor 100, the circuit structure can be simplified and an additional optical receiving processor 100 which inputs a ½ mark ratio data signal is not needed by using clock signals as a ½ mark ratio data signal.

In the eleventh embodiment, the standard reference potential generator 3 shown in FIGS. 8 and 9 may be substituted for the average value detector 33, thus detecting accurately an average potential.

(m) Explanation of the Twelfth Embodiment

Figure 26:
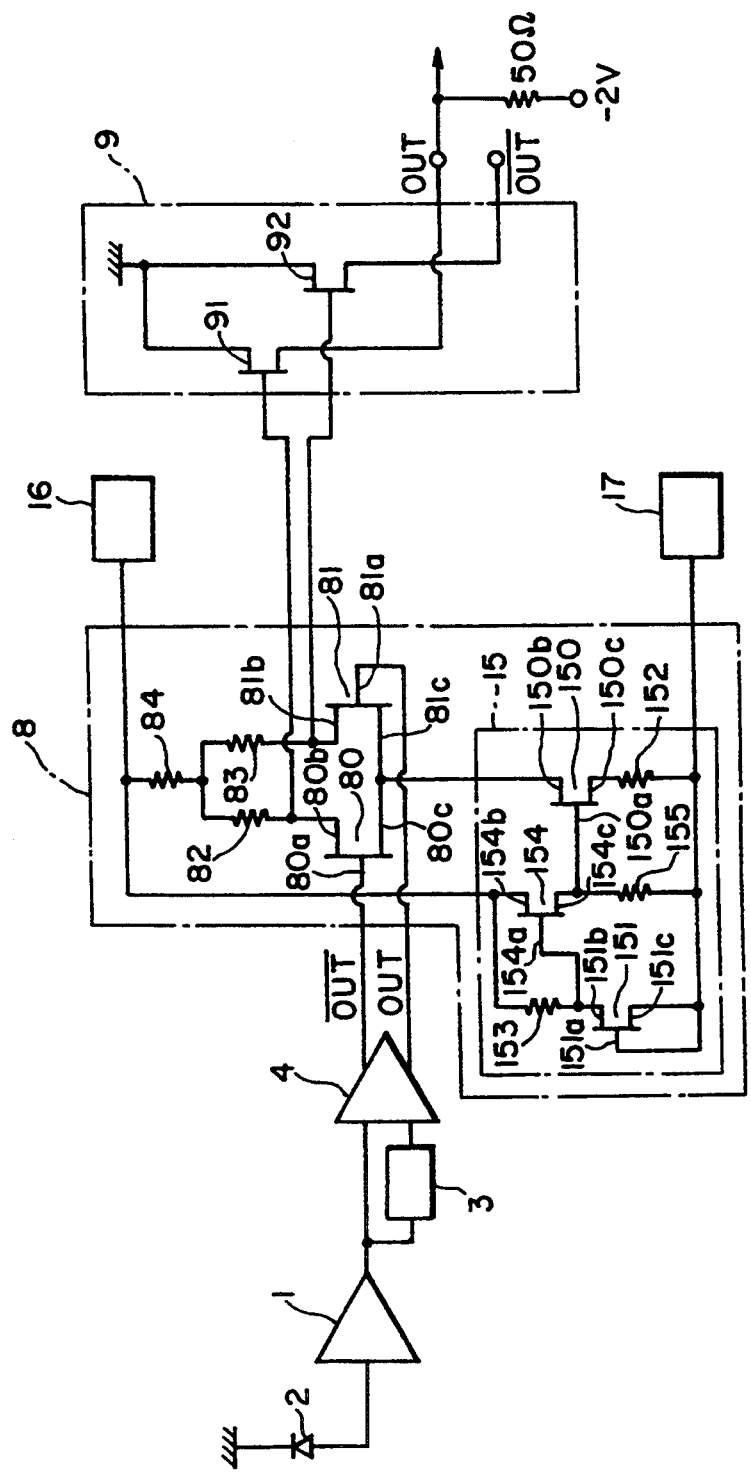
FIG. 26 is a block diagram showing an optical receiver according to the twelfth embodiment of the present invention.

FIG. 26 is a block diagram showing the optical receiver according to the twelfth embodiment of the present invention. In the figure, since like symbols and numerals represent like elements, the duplicate explanation will be omitted below.

The optical receiver shown in FIG. 26 includes a light receiving element 2, a pre-amplifier 1, a standard reference potential generator 3, and a limiter amplifier 4. A differential amplifier 8 and an emitter coupled logic (ECL) output buffer 9 are arranged in the rear to the limiter amplifier 4.

The differential amplifier 8 includes a pair of FETs 80 and 81 having a gate terminal 80a connected to the output signal from the limiter amplifier 4 and a gate terminal 81a connected to the reverse output signal from the limiter amplifier 4, respectively. In the pair of FETs 80 and 81, the drain terminals (one signal terminals) 80b and 81b are connected to the first power source 16 via the resistors 82, 83, and 84, and the source terminals (the other signal terminals) 80c and 81c are connected to the second power source 17. The potentials of the drain terminals 80b and 81b are outputted as differential amplified results.

The ECL output buffer 9 operates in response to the output signals from the differential amplifier 8, and is formed of a pair of FETs 91 and 92 receiving the potentials of the drain terminals 80b and 81b.

A constant current source 15 is arranged between the source terminals 80c and 81c of the pair of the FETs 80 and 81 in the differential amplifier 8 and the second power source 17. In the similar manner to that in FIG. 7, the constant current source 15 is formed of a constant current supplying FET 150, a monitoring FET 151, and a level adjusting FET 154.

The constant current supplying FET 150 has a drain terminal (one signal terminal) 150b connected to the source terminals (the other signal terminals) 80c and 81c of the pair of FETs 80 and 81, a source terminal (the other signal terminal) 150c connected to the second power source 17 via the resistance element 152, and a gate terminal 150a connected to the source terminal 154c of the level adjusting FET 154.

Like the first embodiment shown in FIG. 7, the level adjusting FET 154 has a drain terminal 154b connected to the first power source 16, and a source terminal 154c connected to the gate terminal 150a of the constant current supplying FET 150 and to the second power source 17 via the resistance element 155.

The monitoring FET 151 has the similar characteristic to that of the constant current supplying FET 150 shown in the first embodiment in FIG. 7, and has a drain terminal 151b connected to the first power source 16 via the resistance element 153 and to the gate terminal 154a of the level adjusting FET 154, and a source terminal 151c and a gate terminal 151a connected to the second power source 17.

The drain terminal 151b of the monitoring FET 151 may be directly connected to the gate terminal 150a of the constant current supplying FET 150, by removing the level adjusting FET 154 and the resistance element 155. The gate terminal 151a of the monitoring FET 151, as shown in FIGS. 12 and 13, is connected to the power sources 16 and 17 via the resistance elements 156 and 157 and the variable resistor 159.

In the differential amplifier 8, a constant current source 15 is arranged between the other signal terminals 80c and 81c of the pair of FETs 80 and 81 and the second power source 17. Thus the variation in threshold voltage Vth is compensated automatically in accordance with the gate to source voltage Vgs of the constant current supplying FET 150 to supply a desired constant current Ics with small current variations. The differential amplifier 8 can suppress the gain variations, output amplitude variations, and output potential variations. The present embodiment is suitable when an ECL interface is required.

(n) Explanation of the Thirteenth Embodiment

Figure 27:
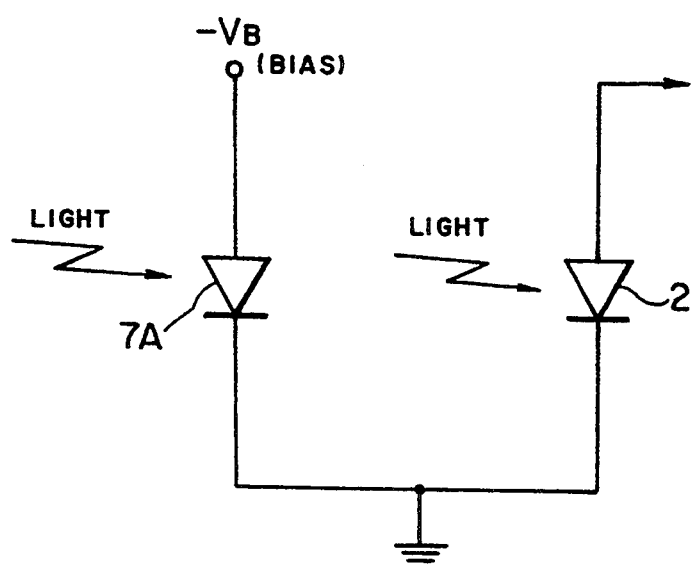
FIG. 27 is a circuit diagram showing the major portion of the optical receiver according to the thirteenth embodiment of the present invention.

FIG. 27 is a circuit structural diagram showing the major portion of the optical receiver according to the thirteenth embodiment of the present invention. The thirteenth embodiment is applicable to the devices shown in FIGS. 15 to 17, and 23 to 25.

The electric field absorption-type optical modulator 7 and the light receiving element 2 can be formed as an integrated circuit as shown in FIG. 27. In FIG. 27, numeral 7A represents an electric field absorption-type optical modulating element forming an electric field absorption-type optical modulator 7, 2 represents a light receiving element. The two elements 7A and 2 are integrally formed with two P-N junctions in the same substrate.

The electric field absorption-type optical modulating element 7A has a terminal receiving the output voltage (bias voltage VB) of the comparison amplifier 6 shown in FIGS. 15 to 17 an d 23 to 25. The modulating element 7A receives an optical input signal from an optical fiber (not shown) and attenuates the optical signal in accordance with the bias voltage VB. The light receiving element 2 converts the resultant optical signal into an electrical signal to supply it to the pre-amplifier 1 shown in FIGS. 15 to 17 and 23 to 25. This feature leads further to the simplification of the circuit configuration and the reduced manufacturing cost.

(o) Explanation of the Fourteenth Embodiment

Figure 28:
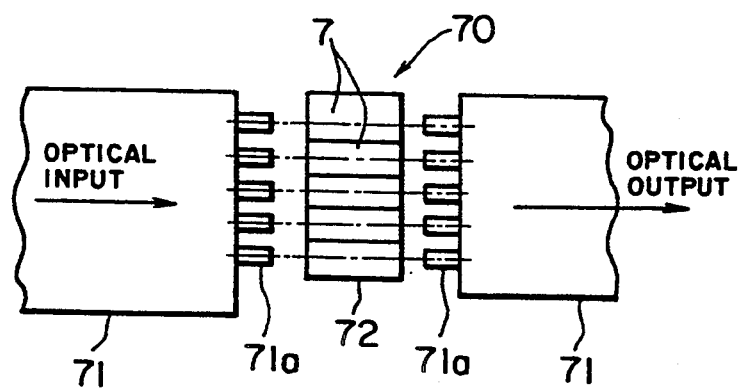
FIG. 28 is a structural diagram showing the major portion of the optical receiver according to the fourteenth embodiment of the present invention.
Figure 29:
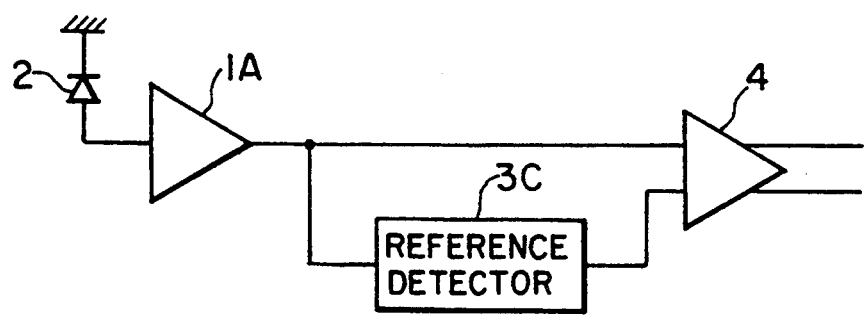
FIG. 29 is a block diagram showing an optical receiver.

FIG. 28 is a structural diagram showing the major portion of the optical receiver according to the fourteenth embodiment according to the present invention. The fourteenth embodiment is applicable to the device shown in FIGS. 23 and 25.

As shown in FIG. 28, the electric field absorption-type optical modulator 7 in each optical receiving processor 100 shown in FIGS. 23 to 25 is arranged between the ribbon fibers 71 and 71 where optical signals in plural channels are inputted in parallel. Plural electric field absorption-type optical modulators 7 forms an electric field absorption-type optical modulator array 72, and are arranged in parallel and integrally with the same pitch as that of the optical fibers 71a in the ribbon fiber 71. A multi-channel optical attenuator 70 is constituted of the electric field absorption-type optical modulator array 72 and the ribbon fiber 71.

In the fourteenth embodiment, a multi-channel optical input is inputted to the one end (not shown) of the ribbon fiber 71 and outputted from the respective optical fibers 71a to the corresponding channels of the electric field absorption-type optical modulator array 72.

The electric field absorption-type modulator array 72 can adjust respectively bias voltages for respective channel modulators. When the attenuation level is adjusted for each channel, the optical signal is transmitted through the corresponding optical fiber 71a in the ribbon fiber 71. This simplified structure can control in parallel the attenuation amounts of optical signals in the plural channels.

What is claimed is:

1. An optical receiving pre-amplifier comprising:
an input field effect transistor having a gate terminal receiving a current signal converted from an optical signal by a light receiving element, one signal terminal connected to a first power source via a resistance element, and an other signal terminal connected to a second power source;
an output field effect transistor having a gate terminal connected to said one signal terminal of said input field effect transistor, one signal terminal connected to said first power source, and an other signal terminal connected to said second power source via a resistance element, for amplifying the current signal into a predetermined voltage signal to issue from an output terminal;
a feedback resistor connected between the gate terminal of said input field effect transistor and the output terminal of said output field effect transistor, for feeding an output signal of said output field effect transistor back to the gate terminal of said input field effect transistor; and
a constant current source connected between the gate terminal of said input field effect transistor and said second power source, for amplifying a change in an amplitude of the output potential of said output field effect transistor in response to a change in an optical signal.

2. An optical receiving pre-amplifier according to claim 1, wherein said constant current source comprises:
a constant current supplying field effect transistor having one signal terminal connected to the gate terminal of said input field effect transistor, and an other signal terminal connected to said second power source via a resistance element; and
a monitoring field effect transistor having the same characteristic as that of said constant current supplying field effect transistor;
said monitoring field effect transistor having one signal terminal connected to said first power source via a resistance element and to a gate terminal of said constant current supplying field effect transistor;
said monitoring field effect transistor having an other signal terminal and a gate terminal connected to said second power source.

3. An optical receiving pre-amplifier according to claim 2, wherein the gate terminal of said monitoring field effect transistor is connected to said first power source via a resistance element and to said second power source via a resistance element, and wherein the other terminal of said monitoring field effect transistor is connected to said second power source via a resistance element.

4. An optical receiving pre-amplifier according to claim 2, wherein the gate terminal of said monitoring field effect transistor is connected to said first power source and said second power source via a variable resistor, and wherein the other signal terminal of said monitoring field effect transistor is connected to said second power source via a resistance element.

5. An optical receiver comprising:
a light receiving element for converting a received optical signal into a current signal;
pre-amplifier for amplifying and outputting the current signal from said light receiving element into a predetermined voltage signal;
a limiter amplifier for amplifying the output signal from said pre-amplifier based on a predetermined standard reference potential; and
a standard reference potential generator for producing a center potential of the amplitude of the output signal from said pre-amplifier as said predetermined standard reference potential to said limiter amplifier;

said pre-amplifier including:

an input field effect transistor having a gate terminal receiving the current signal converted from the optical signal by said light receiving element, one signal terminal connected to a first power source via a resistance element, and an other signal terminal connected to a second power source;

an output field effect transistor having a gate terminal connected to said one signal terminal of said input field effect transistor, one signal terminal connected to said first power source via a resistance element, and an other signal terminal connected to said second power source via a resistance element, for amplifying and outputting said current signal into a predetermined voltage signal;

a feedback resistor connected between the gate terminal of said input field effect transistor and the output terminal of said output field effect transistor, for feeding an output signal of said output field effect transistor back to the gate terminal of said input field effect transistor; and a constant current source connected between the gate terminal of said input field effect transistor and said second power source, for amplifying a change in an amplitude of the output potential of said output field effect transistor in response to a change in an optical signal.

6. An optical receiver according to claim 5, wherein said standard reference potential generator comprises:

a high level peak potential detector for detecting a high level peak potential of the output signal of said pre-amplifier; and a low level peak potential detector for detecting a low level peak potential of the output signal of said pre-amplifier; and an average value detector for averaging respective peak potentials detected by said high level peak potential detector and said low level peak potential detector and for outputting an average result as said predetermined standard reference potential to said limiter amplifier.

7. An optical receiver according to claim 6, wherein said high level peak potential detector has the same circuit configuration as that of said pre-amplifier; whereby when no input signal is inputted to the gate terminal of said input field effect transistor in said high level peak potential detector, an output signal of said output field effect transistor of said high level peak potential detector is outputted as a high level peak potential to said average value detector.

8. An optical receiver according to claim 5, wherein said standard reference potential generator is constituted as a fixed reference potential generator for producing a fixed reference potential as said predetermined standard reference potential to said limiter amplifier when an optical signal power-adjusted by an automatic power adjusting circuit on an optical transmission side is received.

9. An optical receiver according to claim 5, wherein said constant current power source comprises:

a constant current supplying field effect transistor having one signal terminal connected to the gate terminal of said input field effect transistor, and an other signal terminal connected to said second power source via a resistance element; and a monitoring field effect transistor having the same characteristic as that of said constant current supplying field effect transistor;

said monitoring field effect transistor having one signal terminal connected to said first power source via a resistance element and to a gate terminal of said constant current supplying field effect transistor;

said monitoring field effect transistor having an other signal terminal and a gate terminal connected to said second power source.

10. An optical receiver according to claim 6, further comprising:

an electric field absorption-type optical modulator for attenuating a received optical signal in accordance with a bias voltage and then outputting to said light receiving element;

a comparison amplifier for comparing a predetermined standard potential with an output signal of said average value detector in said standard reference potential generator, outputting a deviation amplified as a bias voltage of said electric field absorption-type optical modulator, and controlling the attenuation amount of an optical signal by using said electric field absorption-type optical modulator; and a standard potential generator for producing said predetermined standard potential to output to said comparison amplifier.

11. An optical receiver according to claim 5, further comprising:

an electric field absorption-type optical modulator for attenuating a received optical signal in accordance with a bias voltage and for inputting to said light receiving element;

a center potential generator for producing a center potential of the amplitude of said output signal based on the output signal from said pre-amplifier;

a comparison amplifier for comparing a predetermined standard potential with an output signal from said center potential generator, outputting a deviation amplified as a bias voltage of said electric field absorption-type optical modulator, and controlling an attenuation amount of an optical signal by using said electric field absorption-type modulator; and a standard potential generator for producing said predetermined standard potential to said comparison amplifier;

and wherein said standard reference potential generator is constituted as a fixed reference potential generator for producing a fixed reference potential as said predetermined standard reference potential to output to said limiter amplifier.

12. An optical receiver according to claim 11, wherein said fixed reference potential generator acts as said standard potential generator.

13. An optical receiver comprising:

a plurality of optical receiving processors arranged in parallel; each of said optical receiving processors including:

a light receiving element for converting a received optical signal into a current signal;

a pre-amplifier for amplifying and outputting the current signal from said light receiving element into a predetermined voltage signal; and a limiter amplifier for amplifying the output signal from said pre-amplifier based on a predetermined standard reference potential;

said pre-amplifier including:

an input field effect transistor having a gate terminal receiving a current signal converted from an optical signal by a light receiving element, one signal terminal connected to a first power source via a resistance element, and an other signal terminal connected to a second power source;

an output field effect transistor having a gate terminal connected to said one signal terminal of said input field effect transistor, one signal terminal connected to said first power source, and an other signal terminal connected to said second power source via a resistance element, for amplifying and outputting said current signal into a predetermined voltage signal;

a feedback resistor connected between the gate terminal of said input field effect transistor and the output terminal of said output field effect transistor, for feeding an output signal of said output field effect transistor back to the gate terminal of said input field effect transistor; and a constant current source connected between the gate terminal of said input field effect transistor and said second power source, for amplifying a change in an amplitude of the output potential of said output field effect transistor in response to a change in an optical signal.

14. An optical receiver according to claim 13, wherein said constant current source comprises:

a constant current supplying field effect transistor having one signal terminal connected to the gate terminal of said input field effect transistor, and an other signal terminal connected to said second power source via a resistance element; and a monitoring field effect transistor having the same characteristic as that of said constant current supplying field effect transistor;

said monitoring field effect transistor having one signal terminal connected to said first power source via a resistance element and to a gate terminal of said constant current supplying field effect transistor;

said monitoring field effect transistor having an other signal terminal and a gate terminal connected to said second power source.

15. An optical receiver according to claim 14, further comprising a fixed reference potential generator arranged in common to said plurality of said optical receiving processors, for producing a fixed reference potential as said predetermined standard reference potential to output to said limiter amplifiers in said optical receiving processors.

16. An optical receiver according to claim 13, wherein said constant current source comprises:

a constant current supplying field effect transistor arranged in each of said optical receiving processors and having one signal terminal connected to the gate terminal of said input field effect transistor, and an other signal terminal connected to said second power source via a resistance element; and a monitoring field effect transistor having the same characteristic as that of said constant current supplying field effect transistor and arranged in common to said optical receiving processors;

said monitoring field effect transistor having one signal terminal connected to said first power source via a resistance element and to the gate terminal of said constant current supplying field effect transistor;

said monitoring field effect transistor having an other signal terminal and a gate terminal connected to said second power source.

17. An optical receiver according to claim 13, wherein each of said optical receiving processors comprises:

a low level peak potential detector for detecting a low level peak potential of an output signal of said pre-amplifier;

a high level peak potential detector having the same circuit configuration as said pre-amplifier, for detecting an output signal of said output field effect transistor as a high level peak potential of an output signal of said pre-amplifier when no input signal is inputted to the gate terminal of said input field effect transistor, said high level peak detector being arranged in common to said plurality of said optical receiving processors; and an average value detector arranged to each of said optical receiving processor, for averaging a low level peak potential detected by said low level peak potential detector and a high level peak potential detected by said high level peak potential detector and for outputting an average result as said predetermined standard reference potential to said limiter amplifier.

18. An optical receiver according to claim 13, wherein at least one of said plurality of said optical receiving processors receives a data signal of $\frac{1}{2}$ mark ratio, and includes an average value detector for detecting an average value of an output signal of said pre-amplifier in said optical receiving processor, said output signal of said average value detector being used as said predetermined standard reference potential for said limiter amplifier in each of said plurality of said optical receiving processors.

19. An optical receiver according to claim 18, wherein said data signal of $\frac{1}{2}$ mark ratio is a clock signal.

20. An optical receiver according to claim 13, wherein each of said optical receiving processors comprises:

an electric field effect absorption-type optical modulator for attenuating a received optical signal in accordance with a bias voltage and inputting it to said light receiving element;

a standard reference potential generator for providing a center potential of an amplitude of said output signal as said predetermined standard reference potential based on an output signal from said pre-amplifier to said limiter amplifier;

a comparison amplifier for comparing a predetermined standard potential with said output signal from said standard reference potential generator, outputting the deviation amplified as a bias voltage of said electric field absorption-type optical modulator, and controlling an attenuation amount of an optical signal by said electric field absorption-type optical modulator; and a standard potential generator arranged in common to said plurality of said optical receiving processors, for producing said predetermined standard potential to said comparison amplifier in each of said optical receiving processors.

21. An optical receiver according to claim 13, wherein each of said optical receiving processors includes an electric field absorption-type optical modulator for attenuating a received optical signal in accordance with a bias voltage and for inputting it to said light receiving element; and wherein at least one of said plurality of said optical receiving processors receives a data signal of ½ mark ratio and includes:

an average value detector for detecting an average value of an output signal from said pre-amplifier in said optical receiving processor;

a comparison amplifier for comparing a predetermined standard potential with said output signal from said average value detector, outputting the deviation amplified as a bias voltage of said electric field absorption-type optical modulator, and controlling an attenuation amount of an optical signal by said electric field absorption-type modulator; and a standard potential generator for producing said predetermined standard potential to said comparison amplifier;

whereby the output signal from said comparison amplifier is fused in common as a bias voltage for said electric field absorption-type optical modulator in each of said plurality of said optical receiving processors.

22. An optical receiver according to claim 21, wherein the output signal from said average value detector is used in common as said predetermined standard reference potential for said limiter amplifier in each of said plurality of said optical receiving processors.

23. An optical receiver according to claim 21, wherein said data signal of ½ mark ratio is a clock signal.

24. An optical receiver according to claim 13, wherein at least one of said plurality of said optical receiving processors receives a data signal of ½ mark ratio and includes an average value detector for detecting an average value of an output signal from said pre-amplifier in said optical receiving processors, and wherein said each of said optical receiving processors includes:

an electric field absorption-type optical modulator for attenuating a received optical signal in accordance with a bias voltage and inputting it to said light receiving element;

a comparison amplifier for comparing a predetermined standard potential with an output signal from said average value detector, outputting the deviation amplified as a bias voltage for said electric field absorption-type optical modulator, and controlling an atenuation amount of an optical signal by said electric field absorption-type optical modulator; and a standard potential generator for producing said predetermined standard potential to said comparison amplifier in each of said optical receiving processors.

25. An optical receiver according to claim 24, wherein the output signal from said average value detector is used in common as said predetermined standard reference potential of said limiter amplifier in said plurality of said optical receiving processors.

26. An optical receiver according to claim 25, said data signal of ½ mark ratio is a clock signal.

27. An optical receiver comprising:

a light receiving element for converting a received optical signal into a current signal;

a pre-amplifier for amplifying and outputting the current signal from said light receiving element into a predetermined voltage signal;

a limiter amplifying the output signal from said pre-amplifier based on a predetermined standard reference potential;

a differential amplifier for outputting potentials of one signal terminals of a pair of field effect transistors as a differential amplified result, said pair of field effect transistors having gate terminals for receiving respectively an output signal and an inverted output signal from said limiter amplifier, one signal terminals connected to a first power source via resistance elements, and other signal elements connected to a second power source;

an ECL output buffer for receiving the output signal from said differential amplifier; and a constant current source arranged between said second power source and said other signal terminals of said pair of field effect transistors in said differential amplifier;

said constant current source including:

a constant current supplying field effect transistor having one signal terminal connected to said other signal terminals of said pair of field effect transistors and an other signal terminal connected to said second power source via a resistance element; and a monitoring field effect transistor for having the same characteristic as that of said constant current supplying field effect transistor;

the one signal terminal of said monitoring field effect transistor being connected to the gate terminal of said constant current supplying field effect transistor and to said first power source via a resistance element;

the other terminal and the gate terminal of said monitoring field effect transistor being connected to said second power source.

28. An optical receiver comprising:

a light receiving element for converting a received optical signal into a current signal;

a pre-amplifier for amplifying and outputting the current signal from said light receiving element amplified into a predetermined voltage signal;

a limiter amplifier for amplifying an output signal from said pre-amplifier based on a predetermined standard reference potential; and an electric field absorption-type optical modulator for attenuating said received optical signal in accordance with a bias voltage and inputting it to said light receiving element;

said light receiving element and said electric field absorption-type optical modulator being integrally formed of two P-N junction formed elements on a same substrate.

29. An optical receiver comprising:

a plurality of optical receiving processors arranged in parallel, each including a light receiving element for converting a received optical signal into a current signal, a pre-amplifier for amplifying and outputting the current signal from said light receiving element amplified into a predetermined voltage signal, a limiter amplifier for amplifying an output signal from said pre-amplifier based on a predetermined standard reference potential, and an electric field absorption-type optical modulator for attenuating said received optical signal in accordance with a bias voltage and inputting it to said light receiving element; said electric field absorption-type optical modulator in each of said optical receiving processors being arranged between ribbon fibers receiving in parallel optical signals of plural channels; said plurality of electric field absorption-type optical modulators acting as a multi-channel optical attenuator integrally constituted in parallel with the same pitch of that of optical fibers of said ribbon fiber.

* * * * *